US012266724B2

(12) United States Patent
Udrea et al.

(10) Patent No.: US 12,266,724 B2
(45) Date of Patent: *Apr. 1, 2025

(54) III-V SEMICONDUCTOR DEVICE WITH INTEGRATED POWER TRANSISTOR AND START-UP CIRCUIT

(71) Applicant: CAMBRIDGE GAN DEVICES LIMITED, Cambourne (GB)

(72) Inventors: Florin Udrea, Cambridge (GB); Loizos Efthymiou, Cambridge (GB); Giorgia Longobardi, Cambridge (GB); Martin Arnold, Cambridge (GB)

(73) Assignee: CAMBRIDGE GAN DEVICES LIMITED, Cambourne (GB)

( * ) Notice: Subject to any disclaimer, the term of this patent is extended or adjusted under 35 U.S.C. 154(b) by 540 days.

This patent is subject to a terminal disclaimer.

(21) Appl. No.: 17/609,366

(22) PCT Filed: May 7, 2020

(86) PCT No.: PCT/EP2020/062777
§ 371 (c)(1),
(2) Date: Nov. 5, 2021

(87) PCT Pub. No.: WO2020/225387
PCT Pub. Date: Nov. 12, 2020

(65) Prior Publication Data
US 2022/0310832 A1    Sep. 29, 2022

(51) Int. Cl.
*H01L 29/778* (2006.01)
*H01L 27/02* (2006.01)
(Continued)

(52) U.S. Cl.
CPC ........ *H01L 29/7787* (2013.01); *H01L 27/027* (2013.01); *H01L 27/0605* (2013.01);
(Continued)

(58) Field of Classification Search
CPC .............. H01L 27/027; H01L 27/0605; H01L 27/0738; H01L 27/088; H01L 29/2003;
(Continued)

(56) References Cited

U.S. PATENT DOCUMENTS 6,100,753 A * 8/2000 Lee ..................... G05F 3/247
327/540
10,243,451 B1    3/2019 Knoedgen et al.
(Continued)

FOREIGN PATENT DOCUMENTS

EP        3331026 A2      6/2018
WO    2019012293 A1      1/2019

OTHER PUBLICATIONS

International Search Report and Written Opinion dated Jul. 10, 2020 for corresponding International Application No. PCT/EP2020/062777.

*Primary Examiner* — Ratisha Mehta
*Assistant Examiner* — Brad A Knudson
(74) *Attorney, Agent, or Firm* — Tarolli, Sundheim, Covell & Tummino LLP

(57) ABSTRACT

An Ill-nitride semiconductor based heterojunction power device is disclosed and includes a first and second heterojunction transistors formed on a substrate. The first and second heterojunction transistors include first and second Ill-nitride semiconductor regions formed over the substrate. The first Ill-nitride semiconductor region includes a first heterojunction, a first terminal connected to the first Ill-nitride semiconductor region, a second terminal laterally spaced from the first terminal and connected to the first Ill-nitride semiconductor region, and a first gate region over the first Ill-nitride semiconductor region between the first and second terminals. The second Ill-nitride semiconductor region includes a second heterojunction, a third terminal connected to the second Ill-nitride semiconductor region, a (Continued)

fourth terminal laterally spaced from the third terminal and connected to the second Ill-nitride semiconductor region, first highly doped semiconductor regions of a first conductivity type formed over the second Ill-nitride semiconductor region.

15 Claims, 13 Drawing Sheets

(51) Int. Cl.
| | |
|---|---|
| *H01L 27/06* | (2006.01) |
| *H01L 27/07* | (2006.01) |
| *H01L 27/085* | (2006.01) |
| *H01L 27/088* | (2006.01) |
| *H01L 27/095* | (2006.01) |
| *H01L 29/20* | (2006.01) |
| *H01L 29/205* | (2006.01) |
| *H01L 29/66* | (2006.01) |

(52) U.S. Cl.
CPC ........ *H01L 27/0738* (2013.01); *H01L 27/085* (2013.01); *H01L 27/088* (2013.01); *H01L 27/095* (2013.01); *H01L 29/2003* (2013.01); *H01L 29/205* (2013.01); *H01L 29/66462* (2013.01); *H01L 29/778* (2013.01)

(58) Field of Classification Search
CPC . H01L 29/778; H01L 29/7787; H01L 27/095; H01L 29/205; H01L 29/66462; H01L 21/8252; H01L 29/7786; H01L 29/861; H01L 27/0883; H01L 29/1066; H01L 29/41758; H01L 27/085; H01L 21/8258; H02M 1/32; H02M 3/33507; H02M 1/36; H02M 1/08
See application file for complete search history.

(56) References Cited

U.S. PATENT DOCUMENTS

| | | | | |
|---|---|---|---|---|
| 10,425,075 | B1 * | 9/2019 | Consoer | H02M 1/088 |
| 11,658,236 | B2 * | 5/2023 | Udrea | H01L 29/861 |
| | | | | 257/194 |
| 2003/0132796 | A1 * | 7/2003 | Gailhard | G05F 3/267 |
| | | | | 327/543 |
| 2006/0043501 | A1 | 3/2006 | Saito | |
| 2009/0180304 | A1 | 7/2009 | Bahramian | |
| 2012/0293147 | A1 * | 11/2012 | Briere | H02M 3/155 |
| | | | | 323/282 |
| 2013/0140578 | A1 | 6/2013 | Yu et al. | |
| 2014/0015591 | A1 | 1/2014 | Chen et al. | |
| 2014/0042452 | A1 | 2/2014 | Pendharkar | |
| 2016/0322969 | A1 * | 11/2016 | Padmanabhan | H01L 24/40 |
| 2017/0358495 | A1 | 12/2017 | Jiang | |
| 2020/0044032 | A1 * | 2/2020 | Haeberlen | H01L 29/41766 |
| 2020/0328296 | A1 * | 10/2020 | Hwang | H01L 29/66462 |

* cited by examiner

STATE OF THE ART

STATE OF THE ART

STATE OF THE ART

STATE OF THE ART

STATE OF THE ART

III-V SEMICONDUCTOR DEVICE WITH INTEGRATED POWER TRANSISTOR AND START-UP CIRCUIT

RELATED APPLICATIONS

The present invention is a U.S. National Stage under 35 USC 371 patent application, claiming priority to Serial No. PCT/EP2020/062777, filed on 7 May 2020; which claims priority of U.S. patent application Ser. No. 16/405,537, filed on 7 May 2019, the entirety of both of which are incorporated herein by reference.

FIELD OF THE DISCLOSURE

The present disclosure relates to power semiconductor devices. Particularly, but not exclusively, the disclosure relates to the use of a hetero-structure AlGaN/GaN high electron mobility transistor for an integrated start-up circuit of a switch mode power supply.

BACKGROUND OF THE DISCLOSURE

A power semiconductor device is a semiconductor device that can be used as a switch or rectifier in power electronics. A power semiconductor device is usually used in "commutation mode" (i.e., it is either on or off, or transits between these two states), and therefore has a design optimized for such usage.

Silicon bipolar junction transistors (BJT), Metal-Oxide-Semiconductor field effect transistors (MOSFET) and insulated gate bipolar transistors (IGBT) are common types of power semiconductor switching devices. Their application areas range from switch mode power supplies for consumer electronics, inverter and converters in hybrid and electric cars, motor control, to RF and microwave circuits and telecommunication systems.

A switch mode power supply (SMPS) is an electronic power supply that utilises switching devices such as MOSFETs that continuously turn on and off at high frequency in order to convert electrical power efficiently. Energy storage devices such as capacitors and inductors complete the circuit by supplying power during the non-conduction state of the switching device.

An SMPS transfers power from a DC or AC source (often mains power) to DC loads, such as consumer electronics, while converting voltage and current characteristics. A block diagram of mains operated AC/DC SMPS with output voltage regulation can be seen in FIG. 1.

An SMPS often contains a pulse width modulation (PWM) and/or a frequency modulation (FM) control integrated circuit (IC) for output voltage regulation. The controller is responsible for managing the periods that the power switches present in the SMPS are conducting. Such controllers are often implemented in a feedback loop configuration where an output characteristic of the SMPS is measured (e.g. the supply output voltage). This measured signal is used to determine the time in which the power switch is operated in a conduction or blocking mode. The ratio of conduction mode time over the total period of a switching waveform is defined as the duty cycle. As the DC output load dynamically changes, the controller acts as to adjust the duty cycle such that the necessary output voltage required by the system can be maintained.

In FIG. 1 a feedback is provided from the secondary (output) to the controller. This is known as secondary side control and may involve an opto-coupler. In other topologies primary side control can be used, to eliminate the presence of the opto-coupler.

The controller is powered when the de-coupling capacitor, C, is charged and is essential for the SMPS to operate as desired. This is shown in FIGS. 2 and 3. A DC/DC conversion to power the controller is used as the controller operates at a significantly reduced DC bias voltage compared to the rectified input DC rail voltage ($V_{in}$).

FIG. 2 illustrates a known standard flyback converter which utilises a depletion mode device to charge the de-coupling capacitance of the PWM control IC. The depletion mode MOSFET with an adjustable drain current level powers up the IC operating as a current source with the device being in saturation mode. Resistance, R, can be used to adjust the current level, while changes in the input DC rail ($V_{in}$), will not affect the current level. As the de-coupling capacitor, C becomes increasingly charged, raising the voltage bias on the source of the depletion mode transistor, the gate-source voltage becomes increasingly negative. The depletion mode MOSFET switches to the off-state (i.e. its resistance is greatly increased) as the source voltage approaches the device threshold voltage. A simplified version of the circuit shown in FIG. 2, illustrating the operation of the depletion mode transistor is shown in FIG. 3.

Gallium Nitride (GaN) is a wide band gap material with properties that make it a suitable candidate for use in several fields of application (e.g. radio-frequency electronics, opto-electronics, power electronics) which require solid-state devices.

GaN technology allows transistors with high electron mobility and high saturation velocity to be designed. These properties of GaN have made it a good candidate for high-power and high-temperature microwave applications, for example radar and cellular communications systems. As systems expand in subscribers and desired capacity, interest in increasing their operating frequency and power has grown correspondingly. Higher frequency signals can carry more information (bandwidth) and allow for smaller antennas with very high gain.

Additionally, GaN with its wide bandgap offers the potential for emitting light at higher frequencies for example the green, blue, violet, and ultraviolet portions of the electromagnetic spectrum.

Gallium Nitride (GaN) has increasingly been considered as a very promising material for use in the field of power devices with the potential to lead to increased power density, reduced on-resistance, and high frequency response. The application areas range from portable consumer electronics, solar power inverters, electric vehicles, and power supplies. The wide band gap of the material ($E_g$=3.39 eV) results in high critical electric field ($E_c$=3.3MV/cm) which can lead to the design of devices with a shorter drift region, and therefore lower on-state resistance if compared to a silicon-based device with the same breakdown voltage.

The use of an Aluminium Gallium Nitride (AlGaN)/GaN heterostructure also allows the formation of a two-dimensional electron gas (2DEG) at the hetero-interface where carriers can reach very high carrier mobility ($\mu$=2000 cm$^2$/(Vs)) values. In addition, the piezopolarization charge present at the AlGaN/GaN heterostructure, results in a high electron density in the 2DEG layer (e.g. 1×10$^{13}$ cm$^{-2}$). These properties allow the development of High Electron Mobility Transistors (HEMTs) and Schottky barrier diodes with very competitive performance parameters. An extensive amount of research has focused on the development of power devices using AlGaN/GaN heterostructures.

However, the 2DEG which inherently exists at the AlGaN/GaN hetero-interface creates a challenge when attempting the design of enhancement mode rather than depletion mode devices. Nonetheless, several methods have been proposed which can lead to enhancement mode devices, among them the use of metal insulator semiconductor structures, use of fluorine treatment, recessed gate structures, and use of a p-type GaN layer. Due to the relative maturity and controllability in the epitaxial growth of pGaN layers compared to the other techniques, pGaN/AlGaN/GaN HEMTs are currently the leading structure for commercialization.

FIG. 4 shows schematically a cross section of the active area of a pGaN HEMT, according to the state-of-the-art. The device includes an AlGaN layer 1, a GaN layer 2 (also known as GaN buffer layer), a transition layer 3, a silicon substrate 4, a substrate terminal 5, a SiO2 passivation 6, the surface passivation dielectric 7, a source terminal 8, a drain terminal 9, a gate terminal 10, and a highly p-doped GaN cap 11. The device shown is a lateral three-terminal device with an AlGaN/GaN heterostructure grown epitaxially on a standard silicon wafer. The transition layer 3 is used to allow a high quality GaN layer to be grown despite the significant lattice mismatch between GaN 2 and Si 4. Carbon p-type doping is often added in the GaN layer and in the transition layer. Finally, a thin cap GaN layer is typically added to form the gate with a Magnesium (Mg) p-type doping density greater than $1 \times 10^{19}$ cm$^{-3}$. A typical pGaN gate device has a threshold voltage of ~1.5-2V and gate turn-on bias voltage of ~8V.

While an enhancement mode device is used in some power electronic applications as the main power switch there are applications where a depletion mode device can be more suitable or can be used in addition to an enhancement mode device; for example in start-up circuitry in the power supply applications described above. In general, a depletion mode AlGaN/GaN transistor is made by placing a Schottky metal contact 12, which acts as the gate terminal, directly on the AlGaN layer 1 (excluding the pGaN cap layer which exists in the enhancement mode devices) as seen in FIG. 5.

In state-of-the-art devices it is not straightforward to integrate the start-up component with the main power transistor. This is due to compatibility issues between the Schottky gate used for the normally-on transistors, and the pGaN gate used for the normally-off transistors. In addition, the threshold control of a normally on transistor is limited to the use of the Schottky metallization and furthermore, such control, would be even more limited if a normally-off device using a p-GaN gate was monolithically integrated.

In some state-of-the-art systems, a resistance component is used instead of a depletion mode device. This is a less efficient solution as any changes in the input rail voltage ($V_{in}$) would affect the charging time of the decoupling capacitor, C. To reduce the charging time would either require a reduction in the resistance used (which would increase the charging losses) or a reduction in the size of the capacitance, C which is not often possible.

In state-of-the-art depletion mode Schottky gate devices the threshold voltage of the device (i.e. the gate bias voltage at which the device is considered to move from the on-state to the off-state and vice versa) is dependent on process parameters such as, but not limited to, the AlGaN layer thickness, Aluminium mole fraction and gate metal stack. Therefore, to adjust the threshold voltage to a level which is most suitable for a specific application would require a change in the epitaxial growth and/or the gate metal processing, which is time consuming and expensive. The ability to reliably adjust the device threshold voltage through layout modifications would be significantly less time consuming and more cost efficient in comparison. Such capability does not currently exist in the state-of-the-art.

State-of-the-art depletion mode Schottky gate devices have a limit on the maximum positive gate bias voltage which can be applied on the gate terminal before the main on-state conduction path (i.e. low resistance path) changes from drain-source to gate-source in the on-state. This maximum bias voltage depends on the Schottky barrier height present at the gate contact and does not exceed 2V. A normally-on HEMT device which can be biased beyond this voltage level does not exist in the state-of-the-art.

US 2014/042452 and US 2014/015591 suggest using a depletion mode HEMT in the gate to limit overvoltage.

US 2015/076563 relates to a conventional normally-on HEMT with pGaN islands on the AlGaN layer placed in the same direction as the current flow, between the source and drain terminal. The p-GaN islands are provided alongside the drift region, in the same direction of the current flow between the source and the drain. In this arrangement, p-GaN islands cannot be used to control the threshold voltage of a device.

SUMMARY

The disclosure relates to the use of a monolithically integrated GaN-based device which preferably contains a normally-off enhancement mode field-effect transistor as the main power switch and a high voltage, normally-on, depletion mode transistor as a start-up component.

It is an object of the present disclosure to provide a monolithically integrated GaN-based device which contains a normally-off, enhancement mode transistor as the main power switch and a normally-on, high voltage depletion mode transistor as a start-up component. The enhancement mode transistor may contain continuous stripes or closed shapes of highly doped semiconductor gate structures placed between the main terminals of the power switch, the source, and the drain. The depletion mode transistor may contain a gate structure based on discontinuous highly doped semiconductor layer containing islands within stripes or closed shapes around the cells that act to modulate the conductive path between the high voltage terminal and low voltage terminal, when a gate voltage is provided. All such islands may be connected to the same gate electrode. The start-up component may be further connected to an internal or external capacitor to provide a supply voltage for other electronic components such as the controller or protection circuits in a switch mode power supply.

The devices of the disclosure are advantageous over state-of-the-art devices for the following reasons:
- The start-up component can be integrated monolithically with the main, enhancement mode, power transistor. This integration allows a reduction in the overall system size/costs as well as lower BOM (bill of material) and increased reliability;
- The integration leads to improved performance through the reduction of parasitic components associated with the interconnections between discrete devices;
- Both the enhancement mode and the depletion mode device can be manufactured within the same fabrication process. The ability to form an enhancement mode and depletion mode device without any additional process steps reduces the cost of the integrated device;

The use of a depletion mode HEMT, rather than a resistor, with the enhancement mode device is more energy efficient;

In embodiments where the gate of the depletion mode device includes discrete highly doped regions, the proposed device enables the control of the depletion device threshold voltage through adjustments in the layout design of the transistor rather than adjustments in epitaxial growth or the gate metal stack. Layout re-design can lead to an optimized device at a much lower cost/effort than the other methods used in state-of-the-art devices;

An increased positive gate bias voltage can be applied (>7V) to the depletion mode device before the main on-state conduction channel changes from drain-source to gate-source. At higher positive gate terminal bias, an increased carrier density in the channel beneath the gate terminals may be achieved, reducing the overall on-state resistance and therefore losses of the device.

In one configuration, where the gate is biased at 0V and the source is elevated to higher potential, by charging for example a capacitor, the maximum potential level on the source terminal before the depletion mode transistor turns-off could be adjusted by layout design, more precisely by controlling the distance between the pGaN islands. This is advantageous, as this exact potential level may be dependent on the application. Adjustments of this potential level could be done at layout level without the need for process modifications function of different applications.

According to one aspect of the present disclosure there is provided a III-nitride semiconductor based heterojunction power device comprising:

a first heterojunction transistor formed on a substrate, the first heterojunction transistor comprising:
  a first III-nitride semiconductor region formed over the substrate, wherein the first III-nitride semiconductor region comprises a first heterojunction comprising at least one two dimensional carrier gas of the second conductivity type;
  a first terminal operatively connected to the first III-nitride semiconductor region;
  a second terminal laterally spaced from the first terminal and operatively connected to the first III-nitride semiconductor region;
  a first gate region being formed over the first III-nitride semiconductor region, and between the first terminal and the second terminal; and
a second heterojunction transistor formed on the substrate, the second heterojunction transistor comprising:
  a second III-nitride semiconductor region formed over the substrate, wherein the second III-nitride semiconductor region comprises a second heterojunction comprising at least one two dimensional carrier gas of the second conductivity type;
  a third terminal operatively connected to the second III-nitride semiconductor region;
  a fourth terminal laterally spaced from the third terminal in the first dimension and operatively connected to the second III-nitride semiconductor region;
  a first plurality of highly doped semiconductor regions of a first conductivity type formed over the second III-nitride semiconductor region, the first plurality of highly doped semiconductor regions being formed between the third terminal and the fourth terminal;
  a second gate region operatively connected to the first plurality of highly doped semiconductor regions, wherein one of the first and second heterojunction transistors is an enhancement mode field effect transistor and the other of the first and second heterojunction transistors is a depletion mode field effect transistor.

The disclosure provides an integrated device which may use an enhancement mode HEMT as the main power switch and a high voltage depletion mode HEMT which can power the auxiliary electronics integrated in a switch mode power supply. The depletion mode HEMT in the integrated device described can be used as a start-up device to provide a low voltage, such as 5 V, from a high voltage rail.

In the state-of-the-art systems, such as the circuit shown in FIG. 3, the output voltage is given by the gate threshold voltage. The energy efficiency of this DC/DC conversion is poor, and the losses will be high. Therefore, it can only be used for a short time or for small power.

The use of a depletion mode HEMT in the present disclosure, rather than a resistor in its place, is a more energy efficient and elegant solution.

The monolithic integration of the components described above allows a reduction in the overall system size and costs. It also leads to improved performance through the reduction of parasitic components associated with the interconnections between discrete devices.

Preferably, the starting substrate may be silicon. However, any other substrate compatible with state-of-the-art fabrication processes for GaN devices may be used. Employment of a silicon substrate facilitates low cost, high reproducibility, and wide availability of foundries supporting the process. Alternative substrate materials may include sapphire, silicon carbide (SiC), gallium nitride (GaN), and gallium arsenide (GaAs). Other alternatives may also be possible. Also, this disclosure covers the possibility of growing the III-nitride semiconductor region comprising the heterojunction (or heterostructure) on a first substrate suitable for the purpose and then transferring the heterostructure on a second substrate. The second substrate might be any of the previously mentioned substrates or a different one (e.g. a polydimethylsiloxane, PDMS, flexible substrate, diamond). Silicon as substrate material will be used for illustrative purposes in the embodiments hereafter and in the accompanying drawings.

The first gate region may be formed over the first plurality of highly doped semiconductor regions. The first gate region may comprise an Ohmic contact. Alternatively, the active gate region may comprise a Schottky contact. In principle, the Ohmic contact provides higher hole injection, which could be favourable for trap passivation and stability of the device under high voltage stress conditions, whereas the Schottky contact provides lower gate leakage during on-state.

The first and second terminal may be laterally spaced from each other in the first dimension or alternatively the first and second terminal may be spaced from each other in a second dimension.

The first heterojunction of the first III-nitride semiconductor region may comprise: a first III-nitride semiconductor layer having a first band gap formed over the substrate; a second III-nitride semiconductor layer having a second bandgap different from the first band gap disposed on the first III-nitride semiconductor layer; and at least one two-dimensional carrier gas formed at the interface between the first and second III-nitride semiconductor layers to provide a channel. The second heterojunction of the second III-nitride semiconductor region may comprise: a third III-nitride semiconductor layer having a first band gap formed over the substrate; a fourth III-nitride semiconductor layer having a second bandgap different from the first band gap disposed on the first III-nitride semiconductor layer; and at least one two-dimensional carrier gas formed at the interface between the third and fourth III-nitride semiconductor layers to provide a channel.

Each of the first III-nitride semiconductor layer, second III-nitride semiconductor layer, third III-nitride semiconductor layer, and fourth III-nitride semiconductor layer may comprise any one of gallium nitride (GaN), aluminium gallium nitride (AlGaN) and indium aluminium gallium nitride (InAlGaN).

The heterostructures may comprise elemental semiconductors (e.g. Si, Ge), binary compounds from Group III and Group IV (e.g. GaAs), or Group II and Group VI (e.g. ZnS), or Group III and Group V (e.g. GaN), binary alloy semiconductors (e.g. SiGe), ternary alloys (e.g. AlGaAs), quaternary alloys (e.g. InGaAsP) or even pentary materials (e.g. GaInPSbAs). Some examples of possible heterostructures thus follow: AlGaAs/GaAs, InGaP/GaAs, InP/InGaAs, InAlAs/InGaAs, SiGe/Si, AlGaAs/InGaAs, InAlAs/InGaAs and InAlN/GaN, AlGaN/GaN. Preferably the heterostructures will be an AlGaN/GaN heterostructures comprising a two dimensional electron gas (2DEG); this will be used for illustrative purposes in the embodiments hereafter and in the accompanying drawings. GaN and AlGaN technology allows transistors with high electron mobility and high saturation velocity to be designed.

The at least one two dimensional carrier gas may be a two dimensional electron gas (2DEG) or a two dimensional hole gas (2DHG). The 2DEG has the advantage of much higher carrier mobility than the 2DHG.

The first heterojunction transistor may be configured as an enhancement mode field effect transistor, and the second heterojunction transistor may be configured as a depletion mode field effect transistor.

The second gate region may comprise a Schottky contact. Alternatively, the second gate region may comprise an Ohmic contact.

The first heterojunction transistor may further comprise at least one highly doped semiconductor region formed over the first III-nitride semiconductor region. The at least one highly doped semiconductor region being formed between the first terminal and the second terminal. The first gate terminal may be formed over the at least one highly doped semiconductor region.

The first plurality of highly doped semiconductor regions may comprise at least two highly doped semiconductor regions laterally spaced from each other in a second dimension.

The highly doped semiconductor regions (islands) may be placed on the semiconductor surface of the heterojunction and at zero gate-source terminal bias they create a depletion of the conductive channel (2D carrier gas) directly under it, but not in the region between them where the 2D carrier gas remains un-depleted Thus, an uninterrupted channel is present at zero gate-source bias between the third (source) and fourth (drain) terminals along the paths where the highly doped layer is not present (on the 2D carrier gas formed under the region between the islands). This uninterrupted channel is present as long as the gate-source bias is greater than the first threshold voltage.

With a more negative bias applied to the gate terminal with respect to the source terminal (or alternatively more positive source bias applied to the source with respect to the gate), the carrier concentration in the conductive channel (region) between the drain and source terminals is reduced due to electric field extending from the highly doped islands to the region between the islands. This lateral field (with a direction perpendicular to the current flow) depletes the 2D carrier gas formed under the region between highly doped semiconductor islands and thus obstructs the current path through the 2D carrier gas between the source (third terminal) and the drain (fourth terminal). The critical gate bias value at which the device is considered to move from the on-state (low resistance) to the off-state is defined as the first threshold voltage or the device threshold voltage. Note that as mentioned above, instead of applying a negative potential to the gate with respect to the source terminal, it is also possible to keep the gate grounded and applying a positive potential to the source with the same result.

Each of the highly doped semiconductor regions may be spaced from the nearest other highly doped semiconductor region. The threshold voltage may be controlled by the separation between adjacent highly doped islands, layer thicknesses, and doping fractions. The specific on-state resistance of the depletion mode transistor may be controlled by the number of separations between highly doped islands and the width/area of the highly doped islands with respect to the separation distance/separation area between the islands.

The at least two highly doped semiconductor regions may comprise discrete regions, wherein each of the at least two highly doped semiconductor discrete regions may be separated from the nearest other highly doped semiconductor regions by a predetermined distance. The discrete regions (or discontinuous islands) may be formed such that between adjacent islands there is no highly doped semiconductor layer present, and as such, there is a direct, unobstructed conductive path between the third terminal (source) and the fourth terminal (drain) provided by an un-depleted 2D carrier gas layer. Adjacent islands may be placed close together in a line across (and orthogonal to) the current path, such that the potential applied to the gate modulates the conductive region (i.e. the portion of the 2D carrier gas layer) between the islands and thus modulates the direct path between the source and the drain.

There are advantages at the device level of the proposed depletion mode transistor used as a component of the proposed device, compared to a Schottky gate depletion mode AlGaN/GaN HEMT as shown in the state-of-the-art devices such as that shown in FIG. 5.

The proposed device enables the control of the device threshold voltage through adjustments in the layout design of the transistor rather than adjustments in epitaxial growth or the gate metal stack. Layout re-design leads to an optimized device at a much lower cost/effort than other methods currently available.

The depletion mode device used as a component may be a normally-on depletion mode device where an increased positive gate bias voltage can be applied (>7V) before the main on-state conduction channel changes from drain-source to gate-source. Currently in state-of-the-art devices the voltage at which gate turn-on occurs is typically between 0.7-2V. At a higher positive gate terminal bias, the disclosed device can achieve an increased carrier density in the channel beneath the gate terminals reducing the overall on-state resistance and therefore losses of the device.

The at least two highly doped semiconductor regions may be aligned in the first dimension. In other words, the at least two highly doped semiconductor regions may form a line of highly doped semiconductor regions extending in the second dimension, in a different direction to the current flow between the first terminal and the second terminal.

The depletion mode transistor may have two threshold voltages. The first threshold voltage may be negative and may be equivalent to that of a classical normally-on transistor, indicating the transition from the off-state to the on-state. Preferably, the second threshold voltage may be positive and may be characterised by a steep current increase. The second threshold voltage can occur at the same value as the threshold voltage of the integrated normally-off device featuring a continuous highly doped semiconductor gate.

When the gate voltage of the depletion mode transistor is very negative, the adjacent highly doped semiconductor gate islands deplete the portion of the 2D carrier gas between them, obstructing the path for electrons or holes to flow from the source to drain. Once the gate-source voltage is equal or greater than the first threshold voltage, the 2D carrier gas starts forming at the middle of the pitch between adjacent p-islands. At this stage a conductive path is established between the source and drain. The value of the first threshold voltage can be adjusted by controlling the pitch between adjacent highly doped semiconductor islands. As the gate-source voltage is increased above the first threshold voltage but remaining below the second threshold voltage, the formation of the 2D carrier gas channel spreads from the middle of the pitch between adjacent highly doped semiconductor islands towards the edges of the highly doped semiconductor gate islands. The current continues to increase as the on-state resistance is reduced. When the second threshold voltage (which is preferably positive) is reached, a steep increase in the current is seen as the 2D carrier gas spreads directly under the highly doped (p gate) islands allowing the current to flow through this region, thus resulting in an increase conduction area. This is characterised by a steep increase in current and, as a result, a steep decrease in the on-state resistance. The rate of the current increase depends on the ratio between the width of the highly doped semiconductor gate islands and the pitch between them.

The at least two highly doped semiconductor regions may be in contact with the second III-nitride semiconductor region. Preferably, the at least two highly doped semiconductor regions may be in contact with the fourth III-nitride semiconductor layer.

The first dimension may be perpendicular to the second dimension. Therefore, the highly doped semiconductor regions, and the spaces between adjacent highly doped semiconductor regions, are formed between the source and the drain terminal.

The at least two highly doped semiconductor regions may comprise a p-type gallium nitride (p-GaN) material. The pGaN forms a barrier with the AlGaN material underneath. The high doping of the pGaN facilitates a depletion region to penetrate the AlGaN layer all the way to the 2DEG, function of the potential applied to the gate terminal with respect to the source terminal. Hole tunnelling occurs from the gate terminal into the semiconductor when the potential on the gate is increased. A certain amount of hole current through the gate has a positive effect on the stability of the device during dynamic high voltage stress, but if the current is too high this is seen as leakage in the control terminal affecting the driver and the total losses of the device.

The device may further comprise a transition layer formed between the substrate and the first III-nitride semiconductor region or the second III-nitride semiconductor region. The transition layer may be present between the heterostructure and the bulk substrate to minimise the lattice mismatch or accommodate the mechanical stress in the heterostructure.

The transition layer may comprise a nucleation layer. The nucleation layer may be made of Aluminium Nitride (AlN) or any other suitable material, and may be placed on the substrate. The nucleation layer may form the first sub-layer of a transition layer made of different sub-layers containing the same materials as the first and second semiconductor layers of the heterostructure device (for example AlGaN or GaN materials). This helps to release the mechanical stress and accommodate the lattice mismatch between the substrate (for example silicon) and the heterostructure formed on top.

In embodiments of the disclosure where the substrate is silicon and the heterostructure is based on III-Nitride compounds such as GaN, the transition layer may comprise a single layer of $Al_xGaN_{1-x}N$ (x being the aluminium mole fraction of the compound) or any composition of $Al_xGaN_{1-x}N/Al_yGaN_{1-y}N$ (y being the aluminium mole fraction of the compound) creating a multilayer stack, also known as superlattice.

The first heterojunction transistor and the second heterojunction transistor may be monolithically integrated within a single device, using the same substrate and sharing the AlGaN/GaN layers above the substrate.

Advantageously, the depletion mode transistor could be integrated monolithically with the main, often enhancement mode, power transistor. This integration allows a reduction in the overall system size/costs as well as lower BOM (bill of material) and increased reliability. In addition, it can lead to improved performance through the reduction of parasitic components associated with the interconnections between discrete devices.

The first heterojunction transistor and the second heterojunction transistor may be laterally spaced from each other in the first dimension. The first heterojunction transistor and the second heterojunction transistor may be in physical contact to each other or may be separated by a distance.

The heterojunction power device may further comprise an isolation layer formed between the first heterojunction transistor and the second heterojunction transistor.

The isolation layer could be formed by etching selectively the AlGaN layer all the way to the GaN layer underneath, to remove locally the 2D carrier gas. After etching a passivation layer could be deposited and possibly fill the space created in the recess by etching.

The isolation could be defined in terms of the layout as the part of the device outside the active area (AA mask layer). This signifies the area of the device where a 2D carrier gas layer is not present.

The first heterojunction transistor and the second heterojunction transistor may be formed within the same active area of the device, for example by sharing the drain region and the drain terminal together. Alternatively, the first heterojunction transistor and the second heterojunction transistor may be formed into two distinctive blocks of the active area (i.e. an isolation region is present between them).

The first heterojunction transistor may be configured as a power switch. The first heterojunction transistor may be a normally-off device, as this is preferred, when the device is operated as a switch in power electronics applications. The first heterojunction transistor has to withstand the rated voltage (e.g. 100V, 200 V or 600 V), meaning the at its breakdown voltage has to be in excessed of the rated voltage and transport in the on-state a nominal current (eg. 1 A, 20 A, 100 A) function of the power rating and the requirements of the system where the device is employed. The gate terminal is connected to a gate driver, which could be monolithically integrated with the switch or provided externally. The gate control determines if the switch is on or off or transits between these states. When we refer to a normally-off the device, we mean that at 0V applied between the gate and the source the switch is normally off and only when a positive gate to source voltage is applied, above the threshold voltage the device becomes on. Broadly, in terms of requirements and system operation, the power switch is similar to other power switches such as Power MOSFETs or IGBTs.

The second heterojunction transistor may be configured to operate as a start-up component. As a start-up, the second heterojunction transistor may be a normally-on device (as the first threshold voltage is negative. In a basic example of a start-up scheme, the gate of the second heterojunction transistor may be connected to the ground or the source of the first heterojunction transistor (i.e. power switch). The source of the second heterojunction transistor (i.e. normally-on transistor) could be connected to a capacitor, which could be monolithically integrated or external. The drains of the first and second heterojunction transistors are connected to the same terminal. When the high rail voltage is present on the common drain terminal, the normally on-device is on, charging the capacitor until its source potential is elevated to a potential above the absolute value of the first threshold voltage at which point the second heterojunction transistor which acts as a start-up device, turns-off. This helps to create a low voltage supply for other circuits in the power system (such as controller).

The second heterojunction transistor may be configured to operate as a high electron mobility transistor.

The second heterojunction transistor may be configured to operate a diode. When operated as a diode, preferably, the active gate region may be operatively connected to the third (source) terminal. Alternatively, the active gate region may be operatively connected to the fourth (drain) terminal.

The diode could be used as an anti-parallel diode, conducting current in the opposite direction to the power switch. The diode could be further used as free-wheeling diode. In this case the sources of the tow transistors are connected together, the drains of the two transistors are connected together, the gate of the main switch is the control terminal while the gate of the normally-on transistor is connected to the source of the normally-on transistor to allow a diode operation.

Several such power switches (normally-off transistors) and normally-on transistors configured as anti-parallel diodes could be monolithically integrated. One example is a half bridge configuration where one power switch is operated in the low-side and the other power switch is operated in the high side. Each of these power switches could feature an anti-parallel normally-on transistor configured as diode.

Preferably, the distance between adjacent highly doped semiconductor regions may be less than 1000 nm. More preferably, the distance between adjacent highly doped semiconductor regions may be less than 500 nm.

In both the start-up and the anti-parallel configurations, as mentioned, the second terminal and the fourth terminal may be operatively connected. In other words, the drain terminal of the first heterojunction transistor may be operatively connected to the drain terminal of the second heterojunction transistor. The drain region may be a single drain region wherein both the first heterojunction transistor and the second heterojunction transistor are connected to the single drain region.

The drain region of the first heterojunction transistor and the drain region of the second heterojunction transistor may provide self-isolation between the first heterojunction transistor and the second heterojunction transistor, in embodiments without a separate isolation structure.

In the start-up configuration, the first terminal may be operatively connected to the second gate region. In other words, the source terminal of the first heterojunction transistor may be connected to the gate region of the second heterojunction transistor. The gate of the depletion-mode transistor may be connected to other low-voltage nodes, internal or external, without changing the nature of the invention; for example, the gate of the depletion mode may be connected to an internal or external ground potential or to a potential that is near ground, to an internal or external Kelvin terminal connected to the first terminal or to a low-voltage supply node and by using resistive elements.

The first heterojunction transistor and the second heterojunction transistor may share the same active area. There may be no distinctive isolation between the first heterojunction transistor and the second heterojunction transistor, other than that provided by the drain terminal as self-isolation. The first III-nitride semiconductor region and the second III-nitride semiconductor region may form a continuous semiconductor region. The first heterojunction transistor and the second heterojunction transistor may be formed on a single substrate. The first III-nitride semiconductor region and the second III-semiconductor region may form a single region for both the first heterojunction transistor and the second heterojunction transistor. In other words, the transistors are monolithically integrated sharing the same substrate, transition layers and GaN buffer layers. This helps to reduce the device manufacturing cost, the packaging cost and the bill of material.

According to a further aspect of the present disclosure, there is provided a circuit comprising the heterojunction power device described above, and further comprising a capacitor electrically connected to third terminal of the normally-on transistor. The normally-on transistor of the when used as a start-up device, may be further connected to an internal or external capacitor to provide a supply voltage for other electronic components, such as the controller or protection circuits in a switch mode power supply.

The source terminal of the depletion mode transistor (the third terminal) may be connected to an internal or external decoupling capacitor such that the capacitor is being charged when the depletion mode (first heterojunction) transistor is in the on-state. As the de-coupling capacitor becomes increasingly charged, raising the voltage bias on the source of the depletion mode transistor, the gate-source voltage becomes increasingly negative. The depletion mode transistor switches to the off-state (i.e. its resistance is greatly increased) as the source voltage approaches the device threshold voltage.

According to a further aspect of the present disclosure, there is provided a circuit comprising the heterojunction power device described above, and further comprising an integrated interface circuit providing at least one of the following functions: current control function, voltage control function and disable function. This integrated interface provides improved characteristics of the integrated start-up supply circuit as well as improved integration into a power system.

The integrated interface circuit may comprise one or several current control blocks. The integrated interface circuit may further comprise one or several regulator and disable units. Further, additional capacitors, each forming a capacitance to the third terminal, may be integrated before and after each of the current control blocks and regulator and disable units.

Current control blocks limit the current flowing from the first terminal of the first heterojunction transistor towards the load.

The regulator and disable units have at least one of two purposes. They may regulate the output voltage to the level required by the internal or external load. For example, the voltage at the first terminal of the first heterojunction transistor is 20 V and the output of the regulator and disable unit is 5 V. The second purpose may be to disable to start-up supply to reduce its power consumption, for example by an internal or external signal.

Note that one or several current control blocks and one or several regulator and disable units may be connected in series in any order without changing the nature of the disclosure.

The described circuit may be used to supply power to the system during the start-up phase. The described circuit may further be used to supply power additional integrated circuits on the chip.

In some embodiments, the integrated current control block may be a resistive element. This resistive element can be made using metal layers or the 2DEG layer.

In other embodiments, the current control block may comprise a current source. The current source may comprise of a low-voltage depletion mode HEMT and a resistive element. The source of the low-voltage depletion mode HEMT may be connected to the first terminal of the resistive element and the gate to the second terminal of the resistive element. The second terminal of the resistive element and the drain of low-voltage depletion mode HEMT may form the two terminals of the current control block.

In similar embodiments, an RLC network could be included in parallel or in series with the resistive element or with the current source to improve the characteristics of the current control block.

The current control block may further include a circuit creating an additional voltage drop. Such circuit could be one or several low-voltage diodes, one or several low-voltage HEMT with gate connected to source or a low-voltage enhancement-mode HEMT with a potential divider connected between the drain and source terminal of the HEMT where the midpoint of the potential divider is connected to the gate terminal of the HEMT.

The current control block may further include a circuit that adapts the current in the current control block. Such a current reduction circuit may include a depletion mode HEMT or enhancement mode HEMT in series or in parallel to the resistive element in the current source. The gate of said HEMT may be connected to a node within the integrated pull-down circuit of the regulator and disable unit.

The regulator and disable unit may consist of one or several auxiliary low-voltage heterojunction transistors with a drain, source and gate; wherein the auxiliary gate region terminal is operatively connected to a current control circuit (block) and a pull-down circuit (block). Said low-voltage heterojunction transistors can be depletion mode or enhancement mode.

The current control block may be connected between drain or source of the auxiliary transistor and the auxiliary gate region. The pull-down circuit block may be connected between the auxiliary gate terminal and the third terminal, source of the enhancement mode heterojunction power device (which is the same as the low voltage terminal of the GaN chip).

In some embodiments, the pull-down circuit block can be composed of a series of source-gate connected enhancement-mode HEMTs. In other embodiments, the integrated pull-down circuit block can be a series of Schottky diodes or one or multiple Zener diodes.

In further embodiments, the integrated pull-down circuit block can be one or several normally-on or normally-off HEMTs in parallel or in series. There may be additional capacitors or resistors in series with the HEMTs. The gate potentials of said pull-down HEMTs are controlled to set the voltage drop across the pull-down HEMT and therefore setting the gate voltage of the auxiliary low-voltage heterojunction transistor and the voltage drop across this same auxiliary low-voltage heterojunction transistor.

In one embodiment, the gate terminal of the pull-down HEMT may be connected to the output of a voltage divider between the gate terminal of the auxiliary HEMT and the third terminal.

In a further embodiment, the gate terminal of the pull-down HEMT may be connected to the output of a voltage divider between the drain or source terminal of the auxiliary transistor and the third terminal.

In a further embodiment, an additional current control block is connected to the drain or source of the auxiliary low-voltage heterojunction transistor. This additional current control block is connected to an additional pulldown circuit which is connected to the third terminal. In this embodiment, the gate terminal of the first pull-down HEMT may be connected to the output of a voltage divider across the additional pull-down circuit. In all these embodiments of a pull-down circuit, a voltage divider may consist of resistive elements such as resistors formed of metal or 2DEG; capacitors; current sources formed of a depletion-mode HEMT and with the source connected to the first terminal of a resistive element and the gate connected to the second terminal; Schottky diodes, enhancement mode HEMTs with the gate terminal connected to their source terminal; HEMTs with the gate terminal connected to the output of a voltage divider between their drain and source; or similar voltage divider circuits.

The pull-down circuit may further comprise an element to compensate or reduce the effect of temperature. This element is a particular embodiment of the voltage divider. The first part of the voltage divider may comprise an integrated resistor and the second part of the voltage divider may comprise a current source consisting of a normally-on HEMT with the source connected to the first terminal of an additional resistor and the gate connected to the second terminal of the resistor. The first part of the voltage divider may further comprise a similar current source in parallel to the resistor. The second part of the voltage divider may further comprise a resistor in parallel to the current source.

Both parts of the voltage divider will increase the voltage drop at a given current with increasing temperature. But the current sources and resistors change the voltage drop at a dissimilar rate. By designing the sizes of the normally-on HEMTs and the resistances, the output of the voltage divider can be set by the design in such a way that the voltage drop across the pull-down circuit and/or the voltage drop across the auxiliary HEMT has a much smaller temperature dependence.

In some embodiments, the regulator and disable unit comprises a disable function. The disable function is realized by turning on one or several of normally-on or normally-off HEMTs of the integrated pull-down circuit block. This will reduce the gate potential of the auxiliary HEMT and reduce or interrupt the current through the auxiliary HEMT. The signal that turns on said heterojunction transistors may be referred to as disable signal. The disable signal may be supplied from an external control chip, directly or through an integrated circuit such as a logic inverter or voltage clamp. Further, the disable signal may be supplied by an additional integrated circuit such as voltage protection, logic inverter or current protection circuit.

Since the heterojunction transistors in the current control blocks and in the regulator and disable unit would preferably be low voltage devices, their source and drain terminals could be interchanged as they are commonly made in a symmetrical (or similar) way. By a low-voltage device, we mean a device that can typically have a rated breakdown below 20V and limited current capability (under 100 mA). However, it should be understood that these devices could also be high power or high voltage devices, although this may add cost and complexity.

According to a further aspect of the present disclosure, there is provided a method of manufacturing a III-nitride semiconductor based heterojunction power device, the method comprising:
  forming a substrate;
  forming a first III-nitride semiconductor region formed over the substrate, wherein the first III-nitride semiconductor region comprises a first heterojunction comprising at least one two-dimensional carrier gas of second conductivity type;
  forming a first terminal operatively connected to the first III-nitride semiconductor region;
  forming a second terminal laterally spaced from the first terminal and operatively connected to the first III-nitride semiconductor region; and
  forming a first gate region over the first III-nitride semiconductor region;
  forming a second III-nitride semiconductor region formed over the substrate, wherein the second III-nitride semiconductor region comprises a second heterojunction comprising at least one two-dimensional carrier gas of second conductivity type;
  forming a third terminal operatively connected to the second III-nitride semiconductor region;
  forming a fourth terminal laterally spaced from the third terminal in a first dimension and operatively connected to the second III-nitride semiconductor region;
  forming a first plurality of highly doped semiconductor regions of the first conductivity type over the second III-nitride semiconductor region, between the third terminal and the fourth terminal; and
  forming a second gate region over the first plurality of highly doped semiconductor regions,
  wherein one of the first and second heterojunction transistors is an enhancement mode field effect transistor and the other of the first and second heterojunction transistors is a depletion mode field effect transistor.

The first plurality of highly doped semiconductor regions (in the enhancement mode transistor) and the second plurality of highly doped regions (in the depletion mode transistor) may be manufactured in the same process step. The difference between continuous highly doped semiconductor regions and discontinuous highly doped semiconductor regions may be realized by a layout change of the same mask. Furthermore, the threshold voltage of the normally-off enhancement mode transistor (featuring a continuous layer) could be the same as that of the second threshold voltage of the normally-on depletion mode transistor. The ability to form an enhancement mode and depletion mode device without any additional process steps is advantageous due to cost considerations and facilitates the integration of the first heterojunction transistor and the second heterojunction transistor.

This allows the integration of a high voltage depletion mode GaN device with a high voltage enhancement mode GaN device through a fabrication process which could not be used to form a high voltage depletion mode device with a Schottky contact directly on the top AlGaN layer. In state-of-the-art devices the devices would have to be manufactured using additional process steps, and the monolithically integration would be cumbersome.

DETAILED DESCRIPTION OF THE PREFERRED EMBODIMENTS

The present disclosure will be understood more fully from the accompanying drawings, which however, should not be taken to limit the disclosure to the specific embodiments shown, but are for explanation and understanding only.

Figure 6:
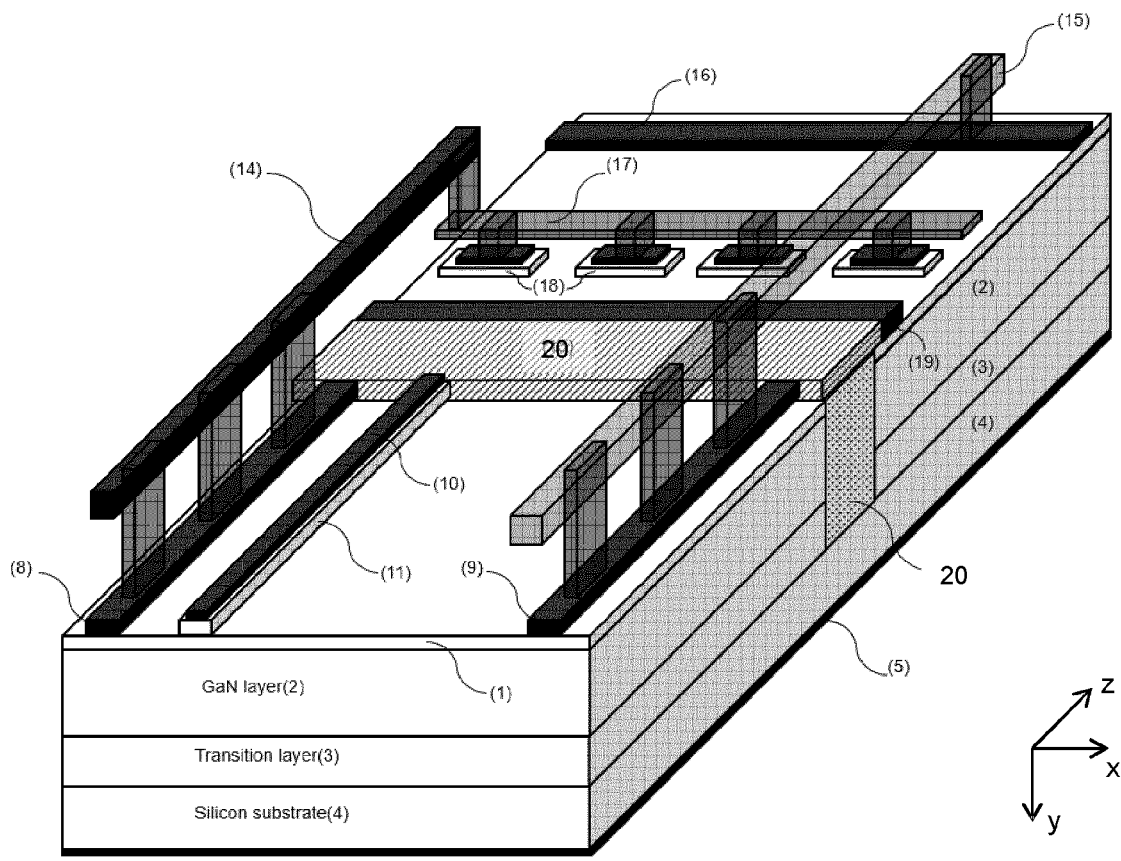
FIG. 6 shows a schematic perspective view of a device according to an embodiment of the present disclosure.

FIG. 6 shows a schematic perspective view of the active area of a GaN based semiconductor device according to an embodiment of the present disclosure. The device is presented in three dimensions: a first dimension (z-direction), a second dimension (x-direction) and a third dimension (y-direction).

In this embodiment, the device comprises a semiconductor (e.g. silicon) substrate 4 defining a major (horizontal) surface at the bottom of the device. It will be appreciated that any other substrates for GaN devices can be used. Examples of alternative substrate material are Sapphire, Silicon Carbide, and GaN.

Below the substrate 4 there is a substrate terminal 5. The device includes a transition layer 3 formed on top of the semiconductor substrate 4. The transition layer 3 comprises a combination of III-V semiconductor materials acting as an intermediate step to allow the subsequent growth of regions of high quality III-V semiconductor materials. The transition layer, also known as a buffer layer, 3 may comprise a single layer of $Al_xGaN_{1-x}N$ (with x varying between 0 and 1) or any composition of $Al_xGaN_{1-x}N$/GaN creating a multilayer stack. It will be appreciated that the buffer layer 3 may not be used in the device, particularly when the substrate 4 is not Si.

On top of the transition layer 3 there is formed a semiconductor region. The semiconductor region comprises several layers. A first semiconductor layer 2 is of high quality III-V semiconductor (for example GaN) and this may comprise several layers itself. The GaN semiconductor layer 2 is grown on top of the buffer 3/substrate 4 stack using a suitable growth technique. Examples of these are Metal-Organic Chemical Vapour Deposition (MOCVD) and Molecular Beam Epitaxy (MBE).

A further semiconductor layer 1 of III-V semiconductor containing a mole fraction of Aluminium is formed on top of the first semiconductor layer 2. The AlGaN layer 1 is formed such that a hetero-structure is formed at the interface between the GaN layer 2 and the AlGaN layer 1 resulting in the formation of a two dimensional electron gas (2DEG).

The device is formed of a high voltage enhancement mode field effect transistor acting as the main power switch and a high voltage depletion mode field effect transistor acting as a start-up component. The enhancement mode transistor and the depletion mode transistor are separated by an isolation region 20. It prevents undesirable conduction between the two transistors.

The enhancement mode transistor includes a high voltage drain terminal 9 arranged in physical contact with the AlGaN layer 1. The high voltage drain terminal 9 forms an Ohmic contact to the 2DEG. A low voltage source terminal 8 is also arranged in physical contact with the AlGaN layer 1 and also forms an Ohmic contact to the 2DEG.

The enhancement mode transistor includes a region of highly p-doped III-V semiconductor 11 formed in contact with the AlGaN semiconductor layer 1. This is formed of p-GaN material in this embodiment. A gate control terminal 10 is configured over the highly doped region 11. The gate terminal consists of a metal contact placed on the p-GaN region 11. The highly doped region 11 is a continuous layer (stripes, or closed shapes around the cells) of a p-type GaN semiconductor placed on the AlGaN layer 1, and the p-type GaN semiconductor 11 is electrically connected to the gate electrode 10.

The depletion mode transistor also includes a high voltage drain terminal 16 arranged in physical contact with the AlGaN layer 1. The high voltage drain 16 terminal forms an Ohmic contact to the 2DEG. A low voltage source terminal 19 is also arranged in physical contact with the AlGaN layer 1 and also forms an Ohmic contact to the 2DEG. The drain 16 and source 19 terminals consist of Ohmic metal contacts on the surface of AlGaN layer 1 or directly in contact with a good electrical connection to the 2DEG.

Regions of highly p-doped III-V semiconductor 18 are formed in contact with the AlGaN semiconductor layer 1. These have the function of reducing the 2DEG carrier concentration under the highly doped regions 18 when the device is unbiased, and are formed of p-GaN material in this embodiment. The p-GaN regions 18 are discrete regions and are spaced from each other in the 2nd dimension (the x-direction). The p-GaN regions 18, also known as p-GaN islands, extend in the x-direction in a discontinuous line. The discontinuous layer of a p-type GaN gate is made of islands placed within stripes or closed shapes. The highly p-doped GaN regions 18 may be Magnesium (Mg) doped. The highly p-doped GaN regions 18 extend along an axis which is perpendicular to the axis connecting the source terminal 19 and the drain terminals 16, where the current flows.

The highly doped layer 18 in the discontinuous gate structure of the depletion mode device may be manufactured in the same process step as the highly doped layer 11 of the enhancement mode device. All p-GaN layers (continuous or discontinuous) can be done in the same process step. The difference between continuous and discontinuous layers is realized by a layout change of the same mask.

A gate control terminal 17 is configured over the highly doped regions 18 in order to control the carrier density of the 2DEG at the interface of the semiconductor layers 1, 2. All the p-GaN islands 18 of the depletion mode device are connected to the same gate electrode 17. The gate terminal 17 consists of metal contacts placed on the intermittent regions of the p-GaN islands 18. The electrical connection between the high voltage terminal (drain) 16 and the low voltage terminal (source) 19 is determined by a voltage signal applied on the third terminal (gate) 17. The gate control terminal 17 can be either an Ohmic contact or a Schottky contact.

The discontinuous layer of a p-type GaN gate 17, 18 of the depletion mode transistor is connected to the source terminal 8 of the high voltage enhancement mode field effect transistor. Therefore the source terminal 8 of the enhancement mode transistor is electrically connected to the gate terminal 17 of the depletion mode transistor.

The drain terminal 9 of the enhancement mode transistor is connected to the drain terminal 16 of the depletion mode transistor.

The source terminal 19 of the depletion mode transistor is connected to an internal or external decoupling capacitor (not shown) such that the capacitor is being charged when the depletion mode transistor is in the on-state. As the de-coupling capacitor becomes increasingly charged (raising the voltage bias on the source 19 of the depletion mode transistor) the gate-source voltage of the depletion mode transistor becomes increasingly negative. The depletion mode transistor switches to the off-state (i.e. its resistance is greatly increased) as the source 19 voltage approaches the device threshold voltage.

Figure 7A:
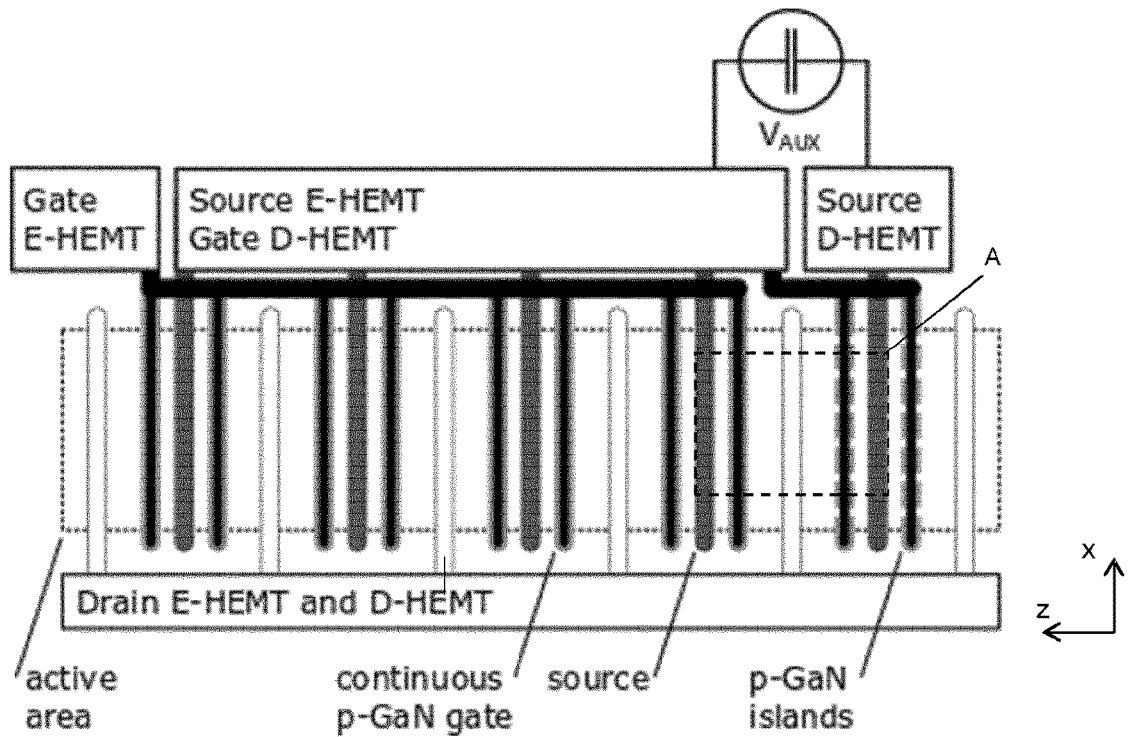
FIG. 7A shows a top view of a device according to a further embodiment of the present disclosure, in which a high voltage transistor and a depletion mode transistor share the same active area.

FIG. 7A shows a top view of a device according to a further embodiment of the present disclosure, in which a high voltage enhancement mode transistor and a depletion mode transistor share the same active area. This figure shows the device in two dimensions: a first dimension (z-direction) and a second dimension (x-direction). This top view of the device shows the high voltage main transistor and the depletion mode transistor. The continuous p-GaN stripes 11 are present in the gate 10 of the main, enhancement transistor while discontinuous stripes 18 are present in the gate 17 of the depletion mode transistor. The pad layout is shown. The gate 17 of the depletion mode transistor and the source 8 of the main switch share the same pad. The two devices share the same active area and there is no specific separation between them, other than the drain region 9, 16. At the boundary, one side of the drain belongs to the main switch while the other side of the drain belongs to the depletion mode transistor.

Figure 7B:
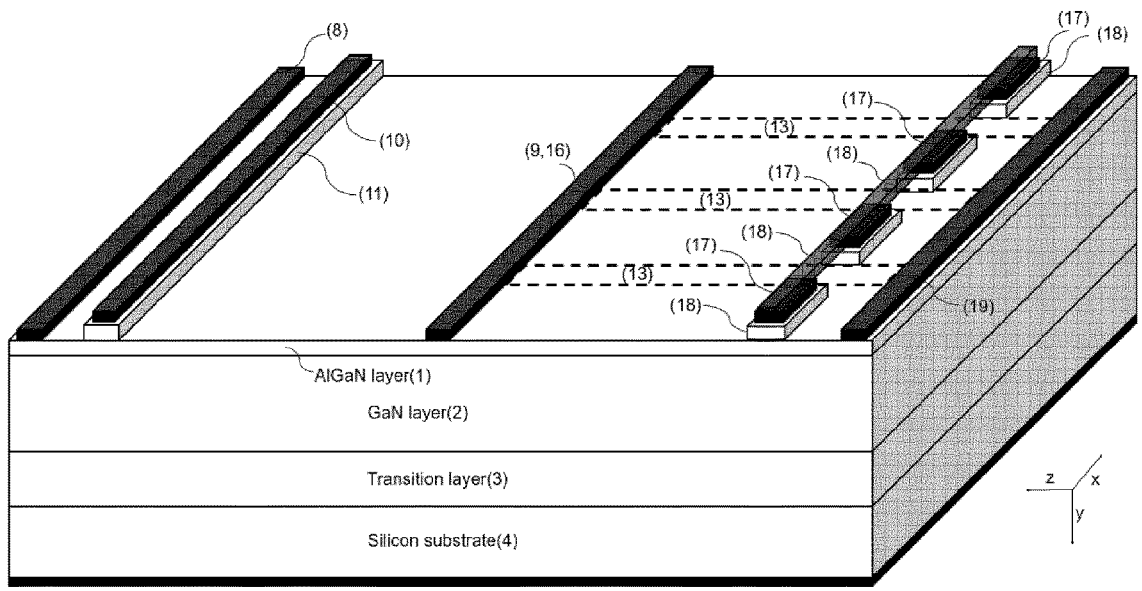
FIG. 7B shows a schematic perspective view of a portion of the device shown in FIG. 7A.

FIG. 7B shows a schematic perspective view of a portion of the device shown in FIG. 7A, indicated by the area A.

Figure 8:
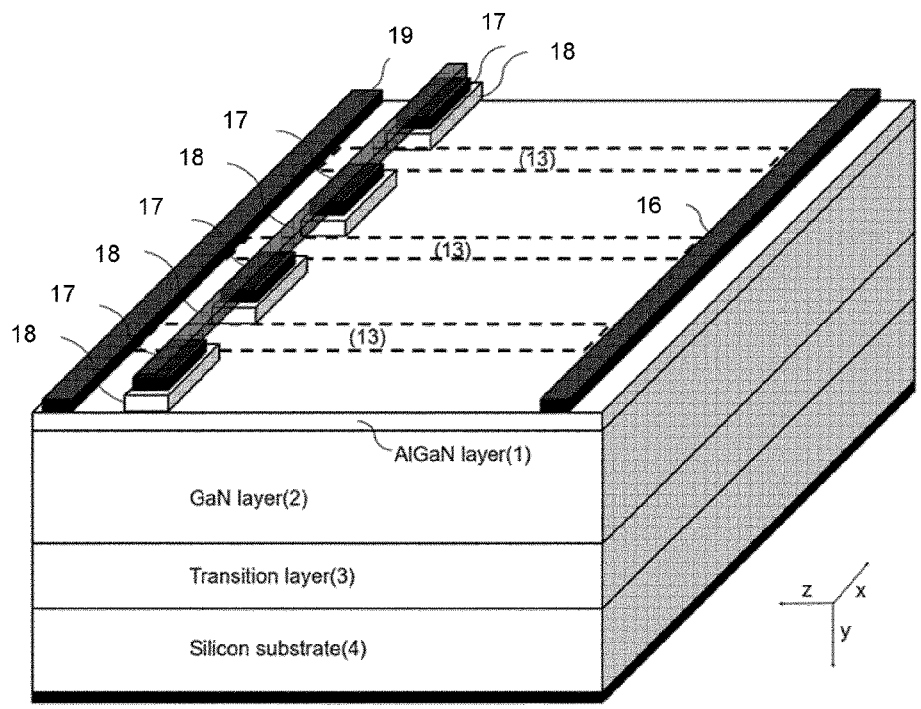
FIG. 8 shows a schematic perspective view of a depletion mode device used as a component in an integrated device according to an embodiment of the disclosure.

FIG. 8 shows a schematic perspective view of a depletion mode device used as a component in an integrated device according to an embodiment of the disclosure.

The 2DEG is formed along the interface between the GaN layer 2 and the AlGaN layer 1. The gate structure of a discontinuous p-GaN layer containing islands 18 within a stripe modulates the conductive path between the high voltage drain terminal 16 and the low voltage source terminal 19, when a gate voltage is provided. By discontinuous islands, it is meant that between adjacent islands 18 there is no p-GaN layer present, and as such, there is a direct, unobstructed conductive path 13 between the source terminal 19 and the drain terminal 16. However, adjacent islands 18 within a stripe are placed closed enough together across (orthogonal to) the current path 13 such that the potential applied to the gate terminal 17 modulates the conductive region 13 between the islands 18 and thus modulates the direct path between the source 19 and the drain 16.

The conductive channel between the drain terminal 16 and the source terminal 19 is a two-dimensional electron gas which is formed at the interface of the AlGaN/GaN heterostructure 1, 2. The p-doped GaN islands 18 are placed on the AlGaN surface 1 of the heterojunction and at zero gate terminal bias create a depletion of the conductive channel (2DEG) under the heterojunction. An uninterrupted channel is present at zero bias between the source terminal 19 and the drain terminal 16 along the paths 13 where the p-doped GaN layer 18 is not present (between the islands 18). At zero bias the conduction channel is present in regions where the p-GaN layer 18 is not present vertically above.

When negative bias is applied to the gate terminal 17 with respect to the source terminal 19, the carrier concentration in the conductive channel (region) between the drain terminal 16 and the source terminal 19 is reduced due to the lateral electric field extending from the p-doped GaN islands 18 to the regions between the islands. The lateral electric field is formed in the x-direction, perpendicular to the axis connecting the source 19 and drain 16 terminals. This lateral field depletes the 2DEG and thus increases the 2DEG resistance between the source 19 and the drain 16. The critical gate bias value at which the device is considered to move from the on-state (low resistance) to the off-state (high resistance) is defined as the first threshold voltage. Note that instead of applying a negative potential to the gate 17, it is also possible to keep the gate 17 grounded and apply a positive potential to the source 19 to achieve the same result. Channel modulation such that the device operates as a transistor is achieved through the lateral JFET depletion of the conductive channel in the regions where the p-GaN islands 18 are not placed vertically above, when the gate terminal 17 is increasingly negatively biased.

Parameters which affect the first threshold voltage include (but are not limited to) the separation between p-doped GaN islands 18, AlGaN layer 1 thickness and aluminium mole fraction of the AlGaN layer 1. Other parameters which affect the specific on-state resistance of the depletion mode transistors are the number of separations between p-doped GaN islands 18 and the length of the p-doped GaN islands 11 with respect to the separation between the islands.

As the discontinuous highly doped semiconductor layer of the depletion mode device is made of islands 18 and by varying the layout spacing between the discontinuous p-type islands 18, the depletion mode transistor is normally-on until its source terminal 19, connected to a capacitor, becomes elevated at a desired voltage level, after which the device turns off.

As the gate-source voltage is increased above the first threshold voltage but remaining below a second threshold voltage, the formation of the 2DEG channel spreads from the middle of the pitch between adjacent p-GaN islands 18 towards the edges of the p-GaN gate islands 18. The current continues to increase as the on-state resistance is reduced.

The depletion mode device features a second threshold voltage which is higher (more positive) than the first threshold voltage. The signature of the second threshold voltage is that of a steep current increase. This second threshold voltage level corresponds to the formation of the 2DEG directly under the p-GaN islands 18 rather than between the islands. A steep increase in the current is seen as the 2DEG spreads under the p-gate islands 18 allowing the current to flow through this region, thus resulting in an increased conduction area. The steepness (or softness) of the current at the second threshold voltage and above the second threshold voltage is reached depends on the ratio between the combined area of the pGaN islands 18 and the combined area of the regions between the pGaN islands (separations). The higher this ratio is the sharper (the steeper) the current increase. If the ratio is low, the current increase, when the second threshold voltage is reached, is smoother. As a result of the steep increase in current there is a steep decrease in the on-state resistance.

The threshold voltage of the depletion mode device can be adjusted through layout modifications in addition to epitaxy/process modifications. The depletion mode device is therefore a normally-on device (as first threshold voltage is negative), but is characterised by a second steep increase in the current when the second threshold voltage is reached. Furthermore, the normally-on, depletion mode device proposed can allow for an increased positive gate bias voltage to be applied (>7V) before the main on-state conduction channel changes from drain-source to gate-source.

Figure 9A:
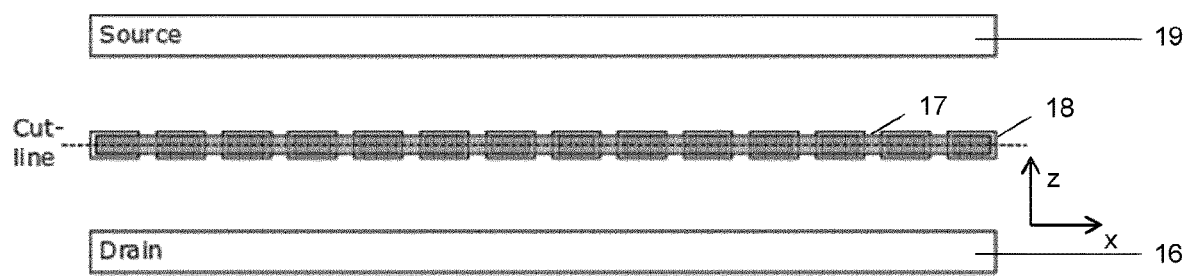
FIG. 9A shows a schematic top view of a depletion mode device used as a component in an integrated device according to an embodiment of the disclosure.

FIG. 9A shows a schematic top view of a depletion mode transistor used as a component in an integrated device according to an embodiment of the disclosure. The depletion mode transistor is similar to that shown in FIG. 8. This figure shows the device in two dimensions: a first dimension (z-direction) and a second dimension (x-direction).

Figure 9B:
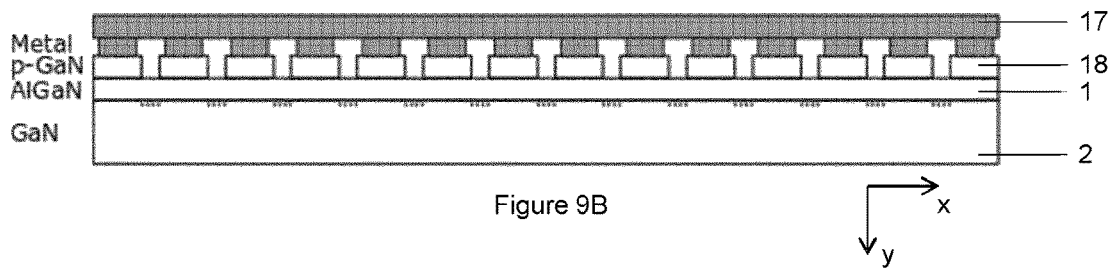
FIG. 9B shows a schematic cross section of the depletion mode device shown in FIG. 9A.

FIG. 9B shows a schematic cross section of the depletion mode device shown in FIG. 9A, along the cutline shown in FIG. 9A. This figure shows the device in two dimensions: a second dimension (x-direction) and a third dimension (y-direction).

Figure 1:
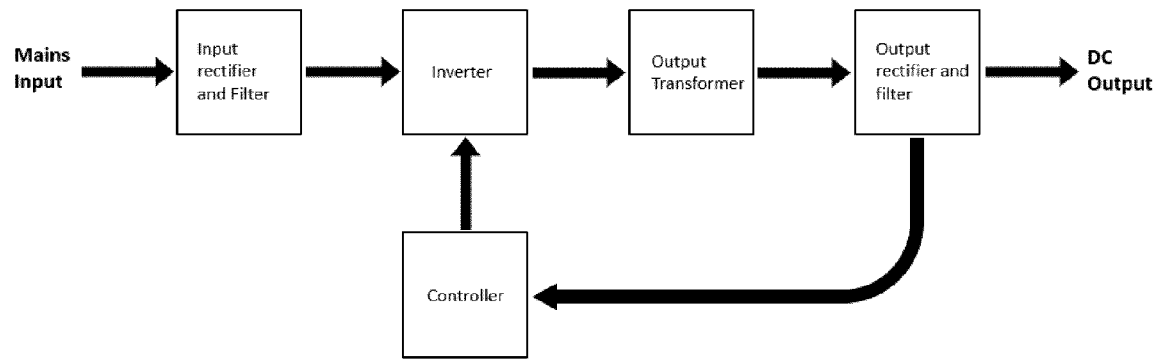
FIG. 1 shows a block diagram of a mains operated AC/DC switch mode power supply (SMPS) with output voltage regulation, according to the state-of-the-art.
Figure 2:
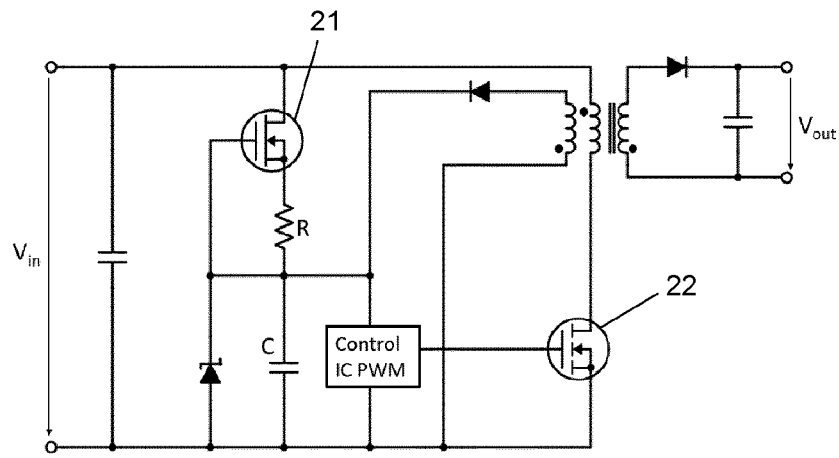
FIG. 2 shows a schematic circuit diagram of a fly-back converter with an enhancement mode power transistor acting as the main power switch and a high voltage depletion mode transistor acting as a start-up component charging the IC controller decoupling capacitor, according to the state-of-the-art.
Figure 3:
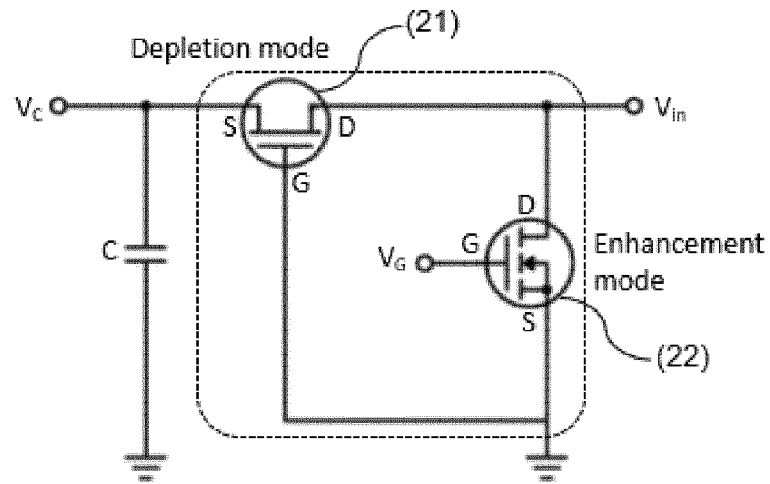
FIG. 3 shows a schematic circuit diagram of an enhancement mode power transistor and a high voltage depletion mode start-up component.
Figure 4:
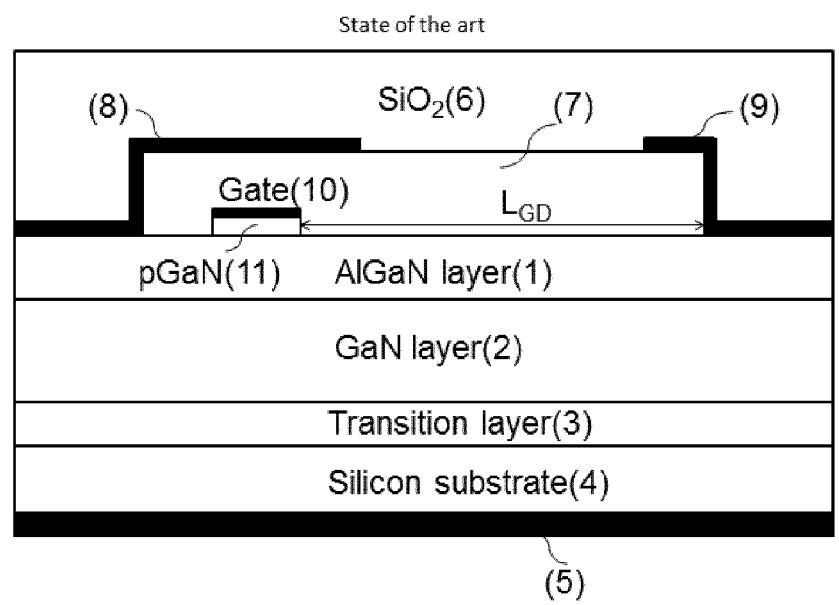
FIG. 4 shows a schematic cross section of the active area of a state-of-the-art enhancement mode p-GaN HEMT, according to the state-of-the-art.
Figure 5:
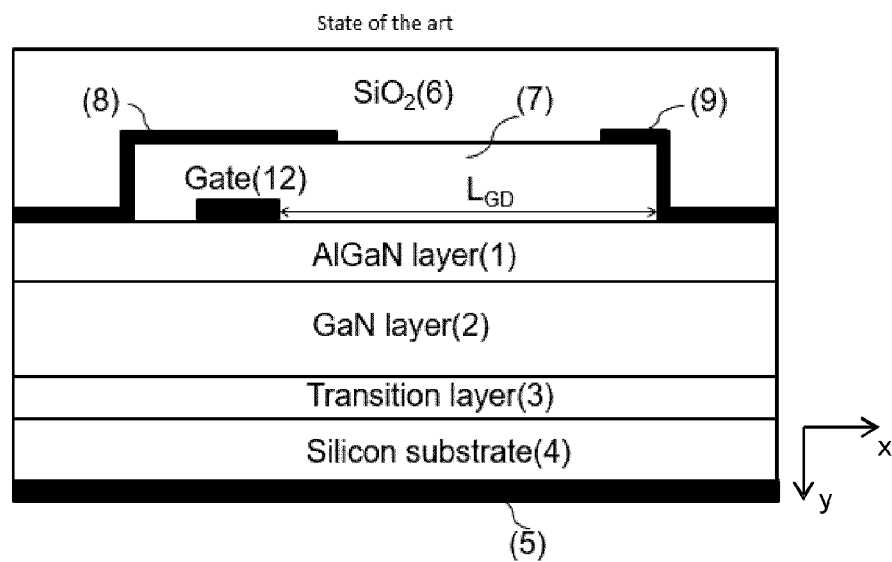
FIG. 5 shows a schematic cross section of the active area of a state-of-the-art depletion mode HEMT with a Schottky gate terminal.
Figure 10A:
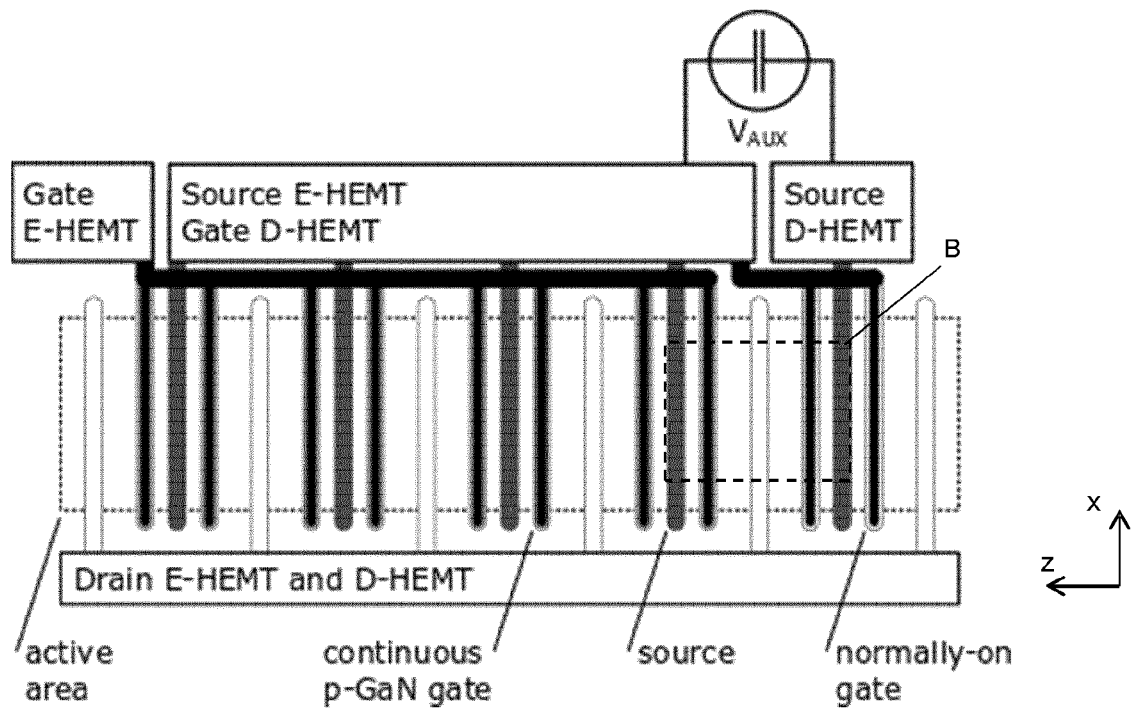
FIG. 10A shows a top view of a device according to a further embodiment of the present disclosure, in which the depletion mode device is a Schottky gate device as shown in FIG. 5.

FIG. 10A shows a top view of a device according to a further embodiment of the present disclosure, in which the depletion mode device is a Schottky gate device as shown in FIG. 5. This figure shows the device in two dimensions: a first dimension (z-direction) and a second dimension (x-direction). In this embodiment the depletion mode device has a Schottky contact 12 as the gate contact.

Figure 10B:
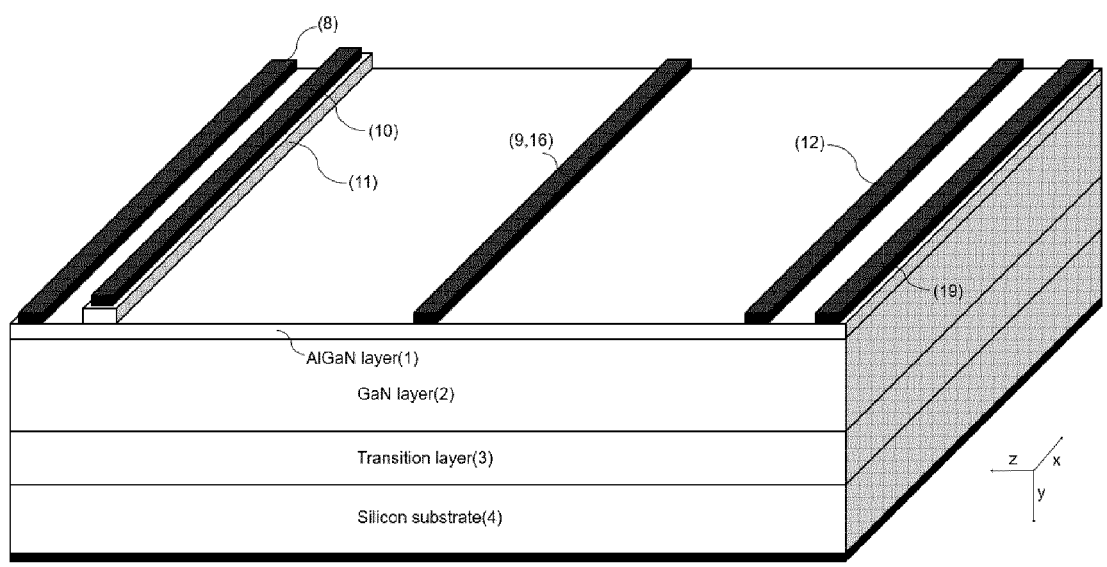
FIG. 10B shows a schematic perspective view of a portion of the device shown in FIG. 10A.

FIG. 10B shows a schematic perspective view of a portion of the device shown in FIG. 10A. The device is presented in three dimensions: a first dimension (z-direction), a second dimension (x-direction) and a third dimension (y-direction).

Figure 11:
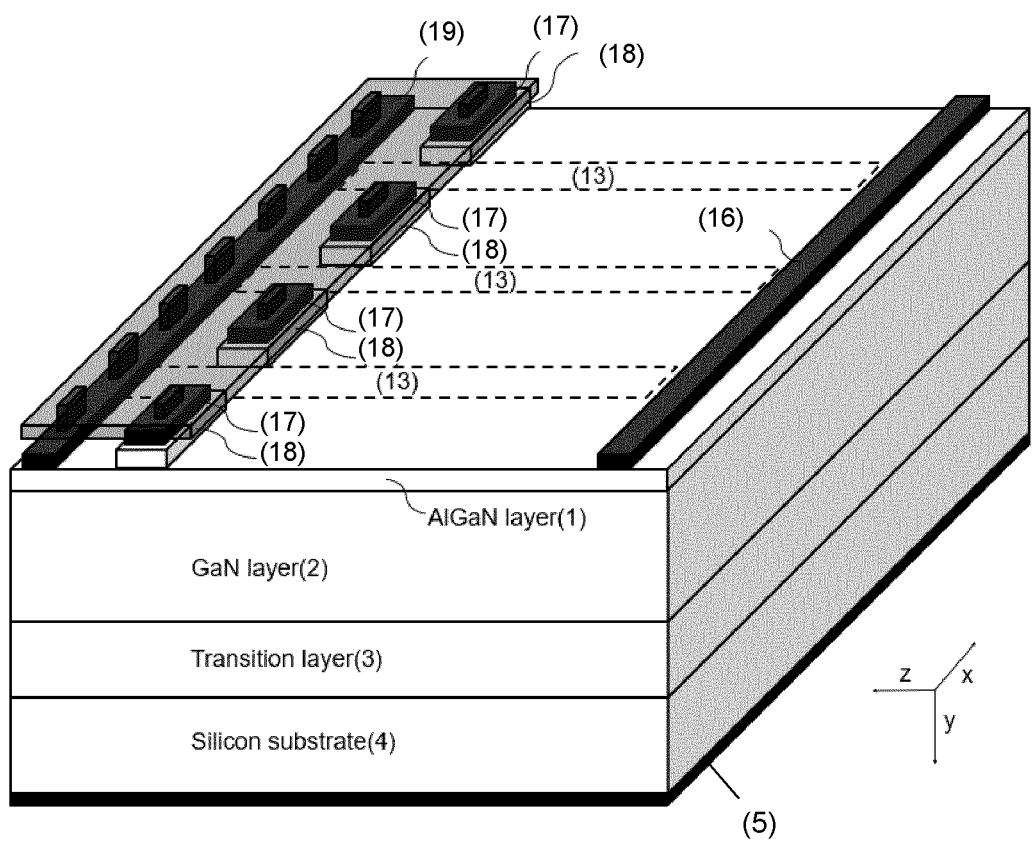
FIG. 11 shows a schematic perspective view of a depletion mode device configured to operate in diode mode used as a component in an integrated device according to an embodiment of the disclosure.

FIG. 11 shows a schematic perspective view of a depletion mode device configured to operate in diode mode used as a component in an integrated device according to an embodiment of the disclosure. The device is presented in three dimensions: a first dimension (z-direction), a second dimension (x-direction) and a third dimension (y-direction). In this embodiment, the normally-on depletion mode MOSFET with discontinuous p-GaN islands 18 is configured to be used in a diode mode, by connecting the gate 17 and source 19 together. Alternatively, this can be done by connecting the drain 16 and gate 17 together.

The distance (pitch) between the p-GaN islands 18 can be used to adjust the voltage level at which the diode conducts current in the forward mode. This is particularly advantageous over the state-of-the-art devices where a continuous p-GaN layer is used, which results in a large forward voltage. For example, the pitch between adjacent p-GaN islands 18 (or adjacent pluralities of p-GaN islands in embodiments of the device with multiple stripes of p-GaN islands) can be used to adjust the opening forward voltage to be about 0.3V to 0.5V, which is specific to Schottky diodes in silicon. Schottky diodes are known to be more efficient than bipolar diodes as they offer lower opening forward voltage and very low reverse recovery losses. To avoid a negative opening voltage, which is undesirable for a diode, the pitch between adjacent p-GaN islands 18 in this embodiment is very small (in the orders of tens or hundreds of nanometres).

A second increase in the current is present at a higher voltage level (higher than the opening voltage level) during forward conduction, when the 2DEG under the p-GaN layer 18 is formed. In order to minimise the on-state resistance in forward conduction, the diode may operate beyond the second threshold voltage.

The diode shown in this embodiment, with source 19 and gate 17 operatively connected to each other and with a drift region present between the drain side of the gate edge 17 and the drain terminal 16, can be used as a high voltage diode. The diode can also be used as a free-wheeling or anti-parallel diode and can also be monolithically integrated with a normally-off GaN based HEMT.

Figure 12A:
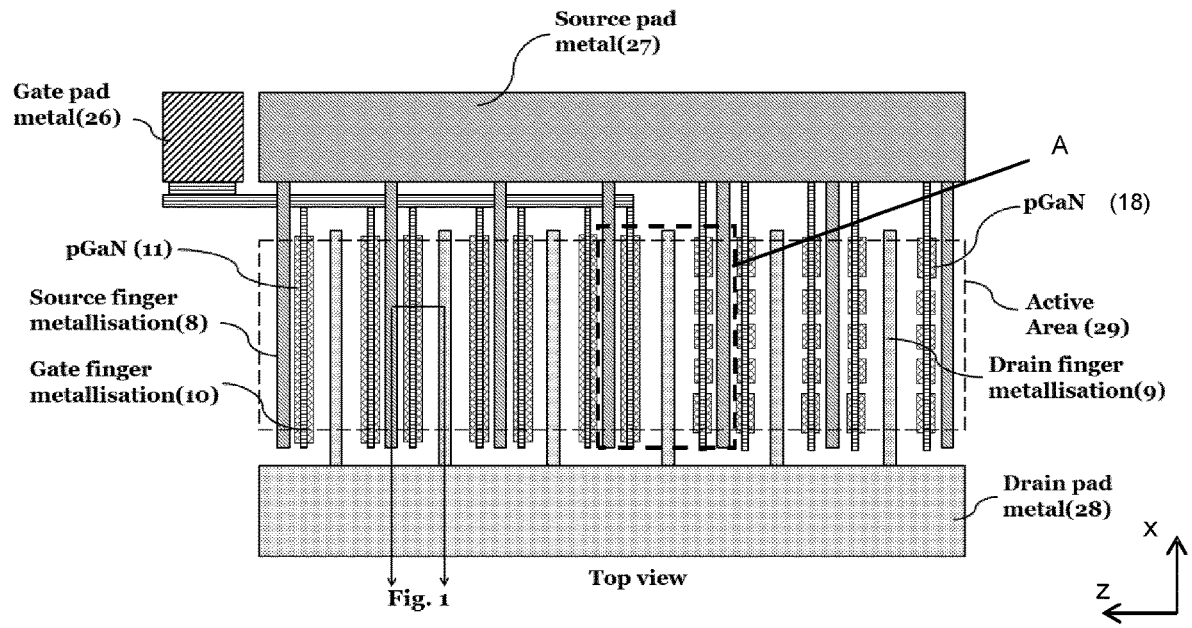
FIG. 12A shows a schematic top view of the layout of a power HEMT with a continuous p-GaN gate monolithically integrated with an anti-parallel diode with a discontinuous p-GaN gate, according to an embodiment of the present disclosure.

FIG. 12A shows a schematic top view of the layout of a power HEMT with a continuous p-GaN gate layer 18 which is monolithically integrated with an anti-parallel diode with a discontinuous p-GaN gate 18, according to an embodiment of the disclosure. The device is presented in three dimensions: a first dimension (z-direction), a second dimension (x-direction) and a third dimension (y-direction). This top view of the device shows the high voltage main transistor and the depletion mode transistor. The continuous p-GaN stripes 11 are present in the gate 10 of the main, enhancement transistor while discontinuous stripes 18 are present in the gate 17 of the diode. The two devices share the same active area and there is no specific separation between them, other than the drain region 9, 16. At the boundary, one side of the drain belongs to the main switch while the other side of the drain belongs to the depletion mode transistor.

Figure 12B:
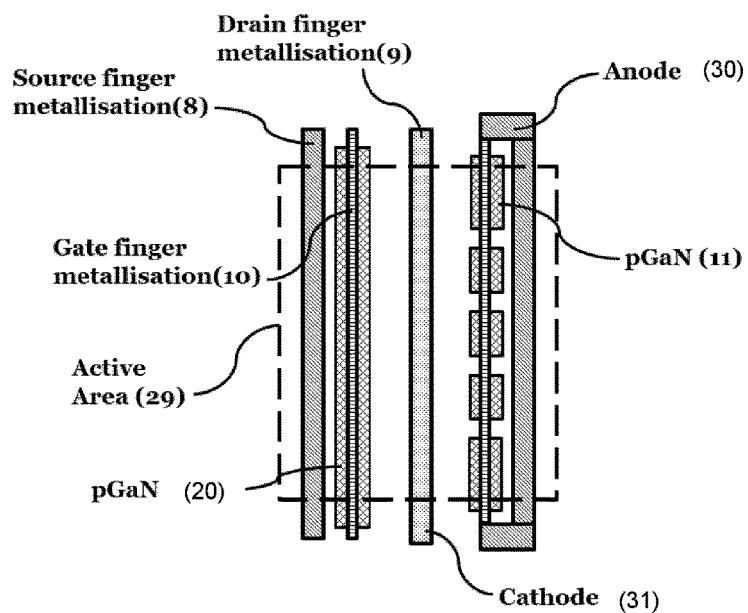
FIG. 12B shows a schematic top view of the layout of a unit cell of the integrated HEMT/anti-parallel diode device shown in FIG. 12A.

FIG. 12B shows a schematic top view of the layout of a unit cell of the integrated HEMT/anti-parallel diode device shown by cell A in FIG. 12A. This figure shows the device in two dimensions: a first dimension (z-direction) and a second dimension (x-direction).

This shows a multiple finger structure used to integrate an anti-parallel diode with discontinuous p-GaN islands 18. The diode in this example is a diode according to an embodiment of the disclosure, as shown in FIG. 11. The main HEMT device is a normally-off device using a continuous p-GaN layer 11 connected to the gate 26 of the device. The diode (which has its source 19 and its internal gate 17 connected together) features discontinuous p-GaN islands 18. In this particular lay-out example (shown here in top view), in individual finger structures, one side of the drain is part of the main power device, the normally-off p-GaN HEMT, while the other side of the drain 16 acts as the cathode 31 of the anti-parallel diode. The anti-parallel diode has the anode 30 terminal formed as its internal source 19 and internal gate 17 connected together. The drain of the main HEMT is connected to the cathode 31 (drain 16) of the anti-parallel diode while the source of the main HEMT is connected to the anode (source 19 and gate 17) of the anti-parallel diode.

When the main HEMT device is in the on-state (with an appropriate gate bias and the drain bias above the source bias) the anti-parallel diode is off. The diode is in forward conduction (on-state) when the source terminal of the HEMT, which is connected to anode 30 of the diode, is at a higher voltage than the drain of the HEMT, which is connected to the cathode 31 of the diode. In this embodiment, the opening voltage of the diode can be controlled by the pitch (distance) between adjacent p-GaN islands 18. In order to enable a transversal depletion region to deplete the 2DEG between the p-GaN islands 18 when the anode terminal 30 is at 0V (the internal source-gate of the diode is at 0V), the pitch between adjacent p-GaN islands 11 is very small.

Alternatively, the source terminal 19 of the diode can be configured as a Schottky contact to avoid the diode having a zero or negative opening voltage. In this case the p-GaN islands 18 also serve to lower the leakage in the off-state, lowering the leakage due to tunnelling through the Schottky contact in the blocking mode (reverse bias of the diode) and pushing the electric field away from the Schottky contact (the anode of the diode), towards the cathode.

The gate contact 17 to the p-GaN islands 18 can be made of Ohmic or Schottky metallisation. The Schottky contact has the advantage of smaller gate leakage currents, while the Ohmic contact is beneficial to increase stability of the device, and to passivate traps in the AlGaN and GaN buffers by hole injection.

Additionally, the diode mode device described here can be used in the pull-down network during turn-off of the auxiliary gate device described in the PCT publication WO/2019/012293A1 and which is incorporated herein by reference in its entirety.

In further examples of embodiments of the present disclosure, there is provided a circuit comprising the heterojunction power device described above, and further comprising an integrated interface circuit providing at least one of the following functions: current control function, voltage control function and disable function. This integrated interface provides improved characteristics of the integrated start-up supply circuit as well as improved integration into a power system.

Figure 13:
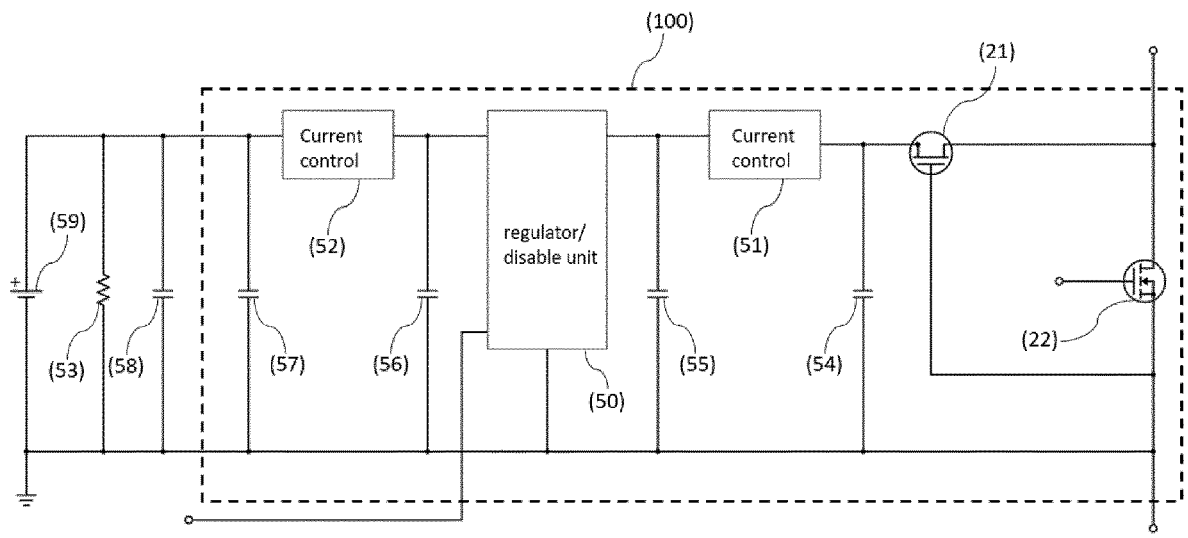
FIG. 13 shows a schematic representation of an embodiment of a startup supply circuit including an integrated interface circuit. The integrated interface circuit consists of one or several current control blocks and one or several regulator and disable units connected in series with the first terminal of the depletion mode heterojunction transistor.

FIG. 13 shows the schematic of an exemplary embodiment of an integrated interface circuit. The circuit consists of a number of building blocks. The drain of this integrated depletion-mode transistor is connected to the drain of the enhancement mode power transistor and the gate is connected to the source terminal of the enhancement mode power transistor. Note, that the gate of the depletion-mode transistor may be connected to other low-voltage nodes, internal or external, without changing the nature of the invention; for example, the gate of the depletion mode may be connected to an internal or external ground potential or to a potential that is near ground, to an internal or external Kelvin terminal connected to the first terminal or to a low-voltage supply node or using resistive elements. In the embodiment shown in FIG. 13, the current from the source of the depletion-mode transistor 21 is passed through a current control block 51 before it reaches the regulator and disable unit 50. The output of the regulator and disable unit may be a lower, regulated voltage. Alternatively, the regulator and disable unit 50 may disconnect the current source from the load side. In the embodiment shown in FIG. 13, the current will flow through a second current control unit 52 before it reaches the load 53. Before and after every block, additional capacitors 54, 55, 56, 57, 58 may be integrated to improve performance. Note that the combination of three integrated blocks in FIG. 13 is merely an example. More or fewer current control blocks and regulator and disable units are possible without changing the nature of the invention.

Figure 14:
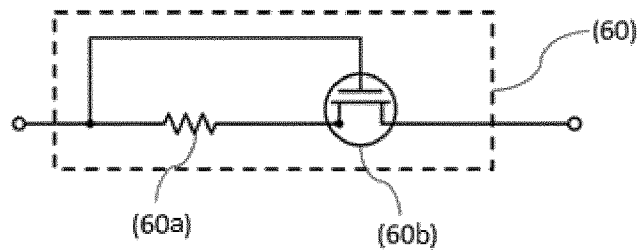
FIG. 14 shows a circuit schematic representation of an embodiment of a current control block comprising a depletion mode heterojunction transistor and a resistive element.

FIG. 14 shows an embodiment of a current control block 60 comprising a depletion mode heterojunction transistor 60b and the resistive element 60a where the source of the transistor is connected to the first terminal of the resistive element and the gate is connected to the second terminal.

Figure 15:
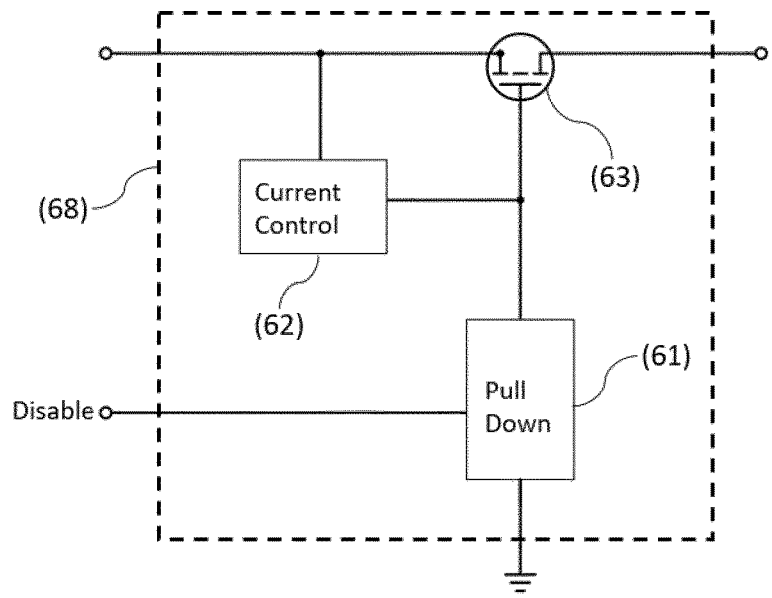
FIG. 15 shows a circuit schematic representation of an embodiment of a regulator and disable unit where the current control block is connected to the source of the auxiliary heterojunction transistor and where the auxiliary heterojunction transistor is a depletion mode transistor.
Figure 16:
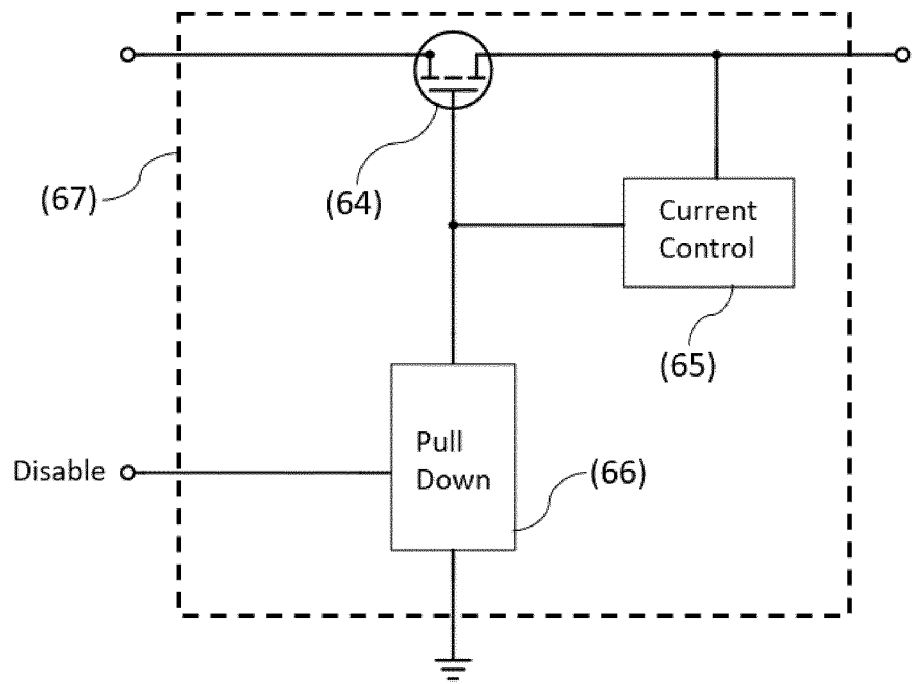
FIG. 16 shows a circuit schematic representation of an embodiment of a regulator and disable unit where the current control block is connected to the drain of the auxiliary heterojunction transistor and where the auxiliary heterojunction transistor is an enhancement-mode transistor.

FIGS. 15 and 16 show two embodiments of a regulator and disable unit 67, 68. These units comprise an auxiliary heterojunction transistor 63, 64 which may be an enhancement mode transistor or a depletion mode transistor. They further comprise a pull-down circuit 61, 66 which defines the voltage at the gate of said auxiliary heterojunction transistor together with a current control block 62, 65. The current control block may be connected to the source of the auxiliary transistor, as shown in FIG. 15, or to the drain, as shown in FIG. 16. Further, the pull-down block 61, 66 may comprise an input terminal for the disable signal. Increasing the disable signal may reduce the voltage drop across the pull-down circuit and, therefore, increase the voltage drop across the auxiliary transistor or even turn off the auxiliary transistor completely.

Figure 17:
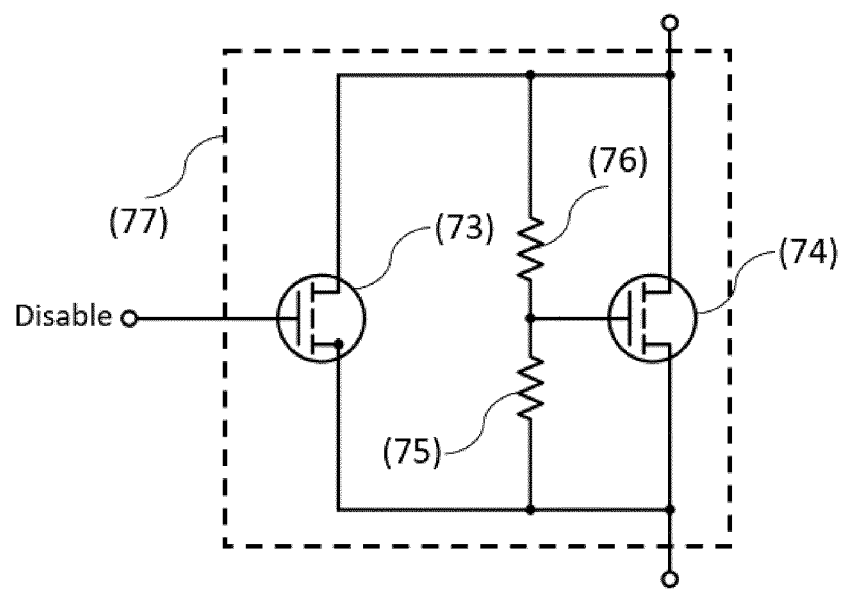
FIG. 17 shows a circuit schematic representation of an embodiment of a pull-down circuit comprising an enhancement mode heterojunction transistor in threshold multiplier configuration and an enhancement mode heterojunction transistor controlled by a disable signal.
Figure 18:
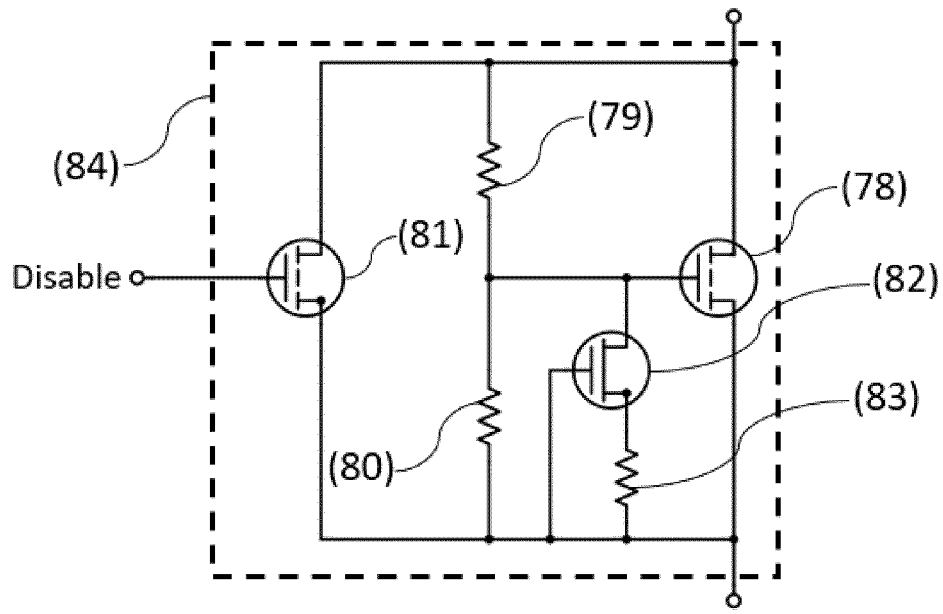
FIG. 18 shows a circuit schematic representation of an embodiment of a pull-down circuit comprising an enhancement mode heterojunction transistor in threshold multiplier configuration and an enhancement mode heterojunction transistor controlled by a disable signal. In this embodiment, the voltage divider of the pull-down circuit comprises a temperature compensation circuit comprising a current source in parallel with a resistive element.

FIGS. 17 to 18 show various exemplary embodiments of a pull-down circuit. FIG. 17 shows an embodiment of a pull-down circuit 77 comprising an enhancement mode heterojunction transistor 74 with the gate connected to the output of a voltage divider 75, 76. FIG. 18 shows an embodiment where a current source 82, 83 is connected in parallel to a resistive element 80 which forms one part of the voltage divider 79, 80. This may change the temperature behaviour of the voltage drop across this part of the voltage divider at a given current. The sizes of the resistive elements and the depletion-mode transistor in the current source may be designed in such a way that the effect of the temperature on the output voltage may partially be compensated.

Figure 19:
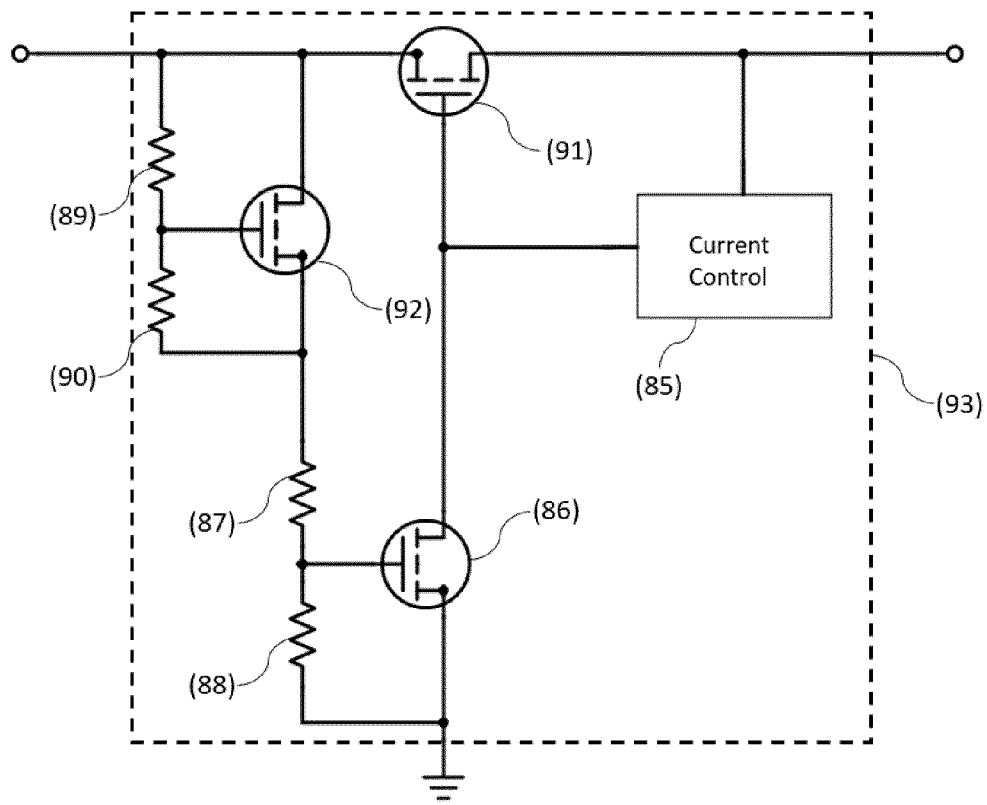
FIG. 19 shows a circuit schematic representation of an embodiment of a regulator and disable unit where the pull-down circuit comprising an enhancement mode heterojunction transistor in threshold multiplier configuration where the voltage divider is connected to the source of the auxiliary heterojunction transistor and where the voltage divider comprises a HEMT in a threshold multiplier configuration.
Figure 20:
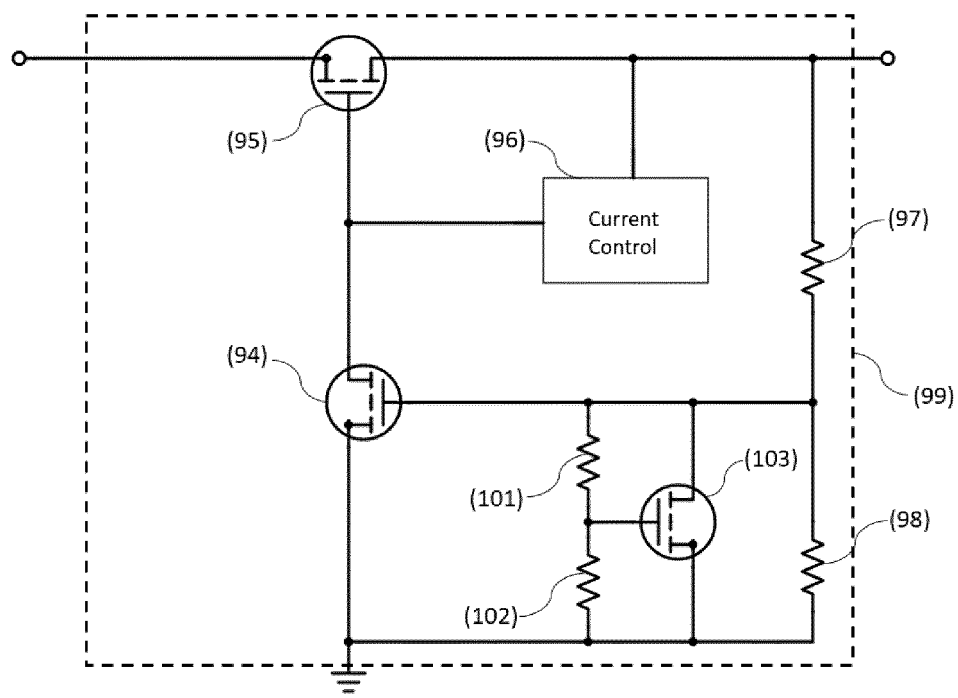
FIG. 20 shows a circuit schematic representation of an embodiment of a regulator and disable unit where the pull-down circuit comprising an enhancement mode heterojunction transistor in threshold multiplier configuration where the voltage divider is connected to the drain of the auxiliary heterojunction transistor and where the voltage divider comprises a HEMT in a threshold multiplier configuration.

FIGS. 19 and 20 show circuit schematic representations of two exemplary embodiments of a regulator and disable units 93, 99 where the voltage dividers 87, 88, 89, 90, 97, 98, 101, 102 of the pull-down circuits are connected to the source, as shown in FIG. 19, or to the drain, as shown in FIG. 20, of the auxiliary heterojunction transistor 91, 95. Further, in these embodiments, the voltage dividers comprise an enhancement mode heterojunction transistor 86, 92, 94, 103 in threshold multiplier configuration. In the embodiment in FIG. 19, the enhancement-mode transistor in threshold multiplier configuration leads to a voltage drop, similar to a Zener diode. Only when the source of the auxiliary transistor reaches this voltage the pull-down circuit is activated. In the embodiment shown in FIG. 20, the same threshold multiplier arrangement limits the gate voltage of the enhancement-mode transistor forming the pull-down circuit.

Figure 21:
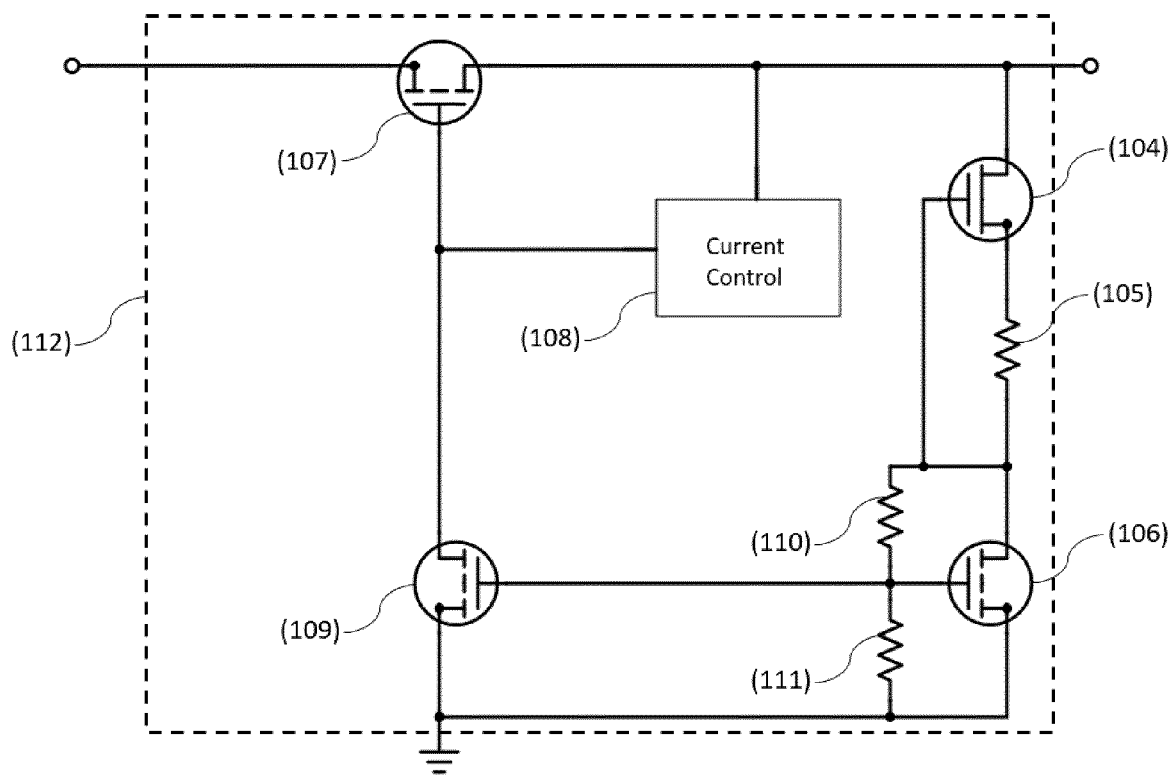
FIG. 21 shows a circuit schematic representation of a further embodiment of a regulator and disable unit where the pull-down circuit comprising an enhancement mode heterojunction transistor in threshold multiplier configuration and where the voltage divider of the pull-down circuit is connected to the source of the auxiliary heterojunction transistor and where the voltage divider comprises a current source, formed of a normally-on HEMT and a resistor, and a HEMT in a threshold multiplier configuration. In this embodiment, the output of the voltage divider is the gate terminal of the HEMT which is in threshold multiplier configuration.

FIG. 21 shows a further embodiment of a regulator and disable unit 112 where the voltage divider of the pull-down circuit is connected to the drain of the auxiliary transistor 107. In this embodiment, the voltage divider comprises an additional current control block 104, 105 and an enhancement transistor 106 in threshold multiplier configuration and where the output of the voltage divider is the gate of the latter transistor.

Figure 22:
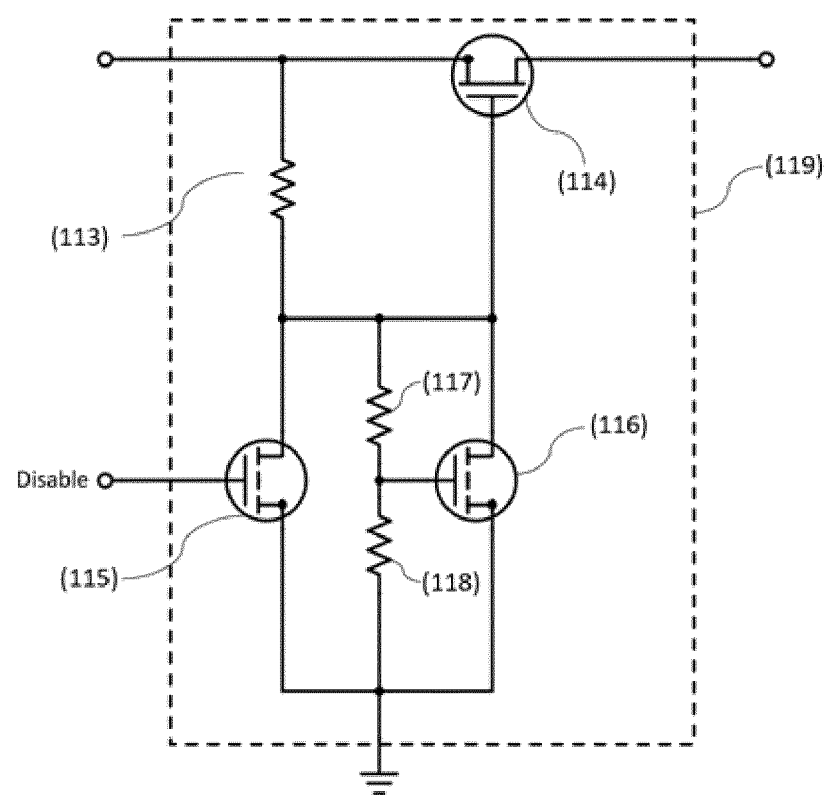
FIG. 22 shows a circuit schematic representation of a further embodiment of a regulator and disable unit where the pull-down circuit comprising an enhancement mode heterojunction transistor in threshold multiplier configuration. In this embodiment, the current control block comprises a restive element connected to the source of the auxiliary heterojunction transistor. Further, it comprises an enhancement mode heterojunction transistor controlled by a disable signal.

FIG. 22 shows a circuit schematic representation of a further exemplary embodiment of a regulator and disable unit 119 where the pull-down circuit comprises an enhancement mode heterojunction transistor 116 in threshold multiplier configuration. In this embodiment, the current control block comprises a restive element 113 connected to the source of the auxiliary heterojunction transistor. Further, it comprises an enhancement mode heterojunction transistor 115 controlled by a disable signal.

LIST OF REFERENCE NUMERALS

1 AlGaN layer
2 GaN layer
3 Transition layer
4 Substrate
5 Substrate terminal
6 SiO$_2$ passivation
7 Surface passivation dielectric
8 Enhancement mode source terminal
9 Enhancement mode drain terminal
10 Enhancement mode gate terminal
11 Enhancement mode p-GaN cap
12 Schottky gate terminal
13 Conduction channel at zero bias
14 Enhancement mode source terminal to depletion mode gate terminal connection
15 Enhancement mode drain terminal to depletion mode drain terminal connection
16 Depletion mode drain terminal
17 Depletion mode gate terminal
18 Depletion mode p-GaN regions
19 Depletion mode source terminal
20 Isolation
21 Depletion mode device
22 Enhancement mode device
26 Gate pad metal
27 Source pad metal
28 Drain pad metal
29 Active area
30 Diode anode
31 Diode cathode
50 Disable unit
51 Current control block
52 Current control block
53 Resistive element
54 Capacitor
55 Capacitor
56 Capacitor
57 Capacitor
58 Capacitor
59 Voltage source
60 Current control block
60a Resistive element
60b Heterojunction transistor
61 Pull down circuit
62 Current control block
63 Auxiliary heterojunction transistor
64 Auxiliary heterojunction transistor
65 Current control block
66 Pull down circuit
67 Regulator and disable unit
68 Regulator and disable unit
73 Heterojunction transistor
74 Heterojunction transistor
75 Resistive element
76 Resistive element
77 Pull down circuit
78 Heterojunction transistor
79 Resistive element
80 Resistive element
81 Heterojunction transistor
82 Heterojunction transistor
83 Resistive element
84 Pull down circuit
85 Current control block
86 Heterojunction transistor
87 Resistive element
88 Resistive element
89 Resistive element
90 Resistive element
91 Heterojunction transistor
92 Heterojunction transistor
93 Regulator and disable unit
94 Heterojunction transistor
95 Heterojunction transistor
96 Current control block
97 Resistive element
98 Resistive element
99 Regulator and disable unit
100 GaN integrated circuit
101 Resistive element
102 Resistive element
103 Heterojunction transistor
104 Heterojunction transistor
105 Resistive element
106 Heterojunction transistor
107 Heterojunction transistor
108 Current control block
109 Heterojunction transistor
110 Resistive element
111 Resistive element
112 Regulator and disable unit
113 Resistive element
114 Heterojunction transistor
115 Heterojunction transistor
116 Heterojunction transistor
117 Resistive element
118 Resistive element
119 Regulator and disable unit In this disclosure, unless explicitly specified, the heterojunction transistor may be any known transistor based on a heterojunction such as a p-Gate HEMT transistor, or a Schottky gate transistor or an insulated gate transistor such as MISFET (Metal Insulating Semiconductor Field Effect Transistor). The diodes can be Schottky diodes, Zener diodes or pn diodes or diodes made of a transistor by connecting the gate terminal with any of its other terminals. The heterojunction chip or the heterojunction power device described in this disclosure can be referred to as a heterojunction smart power device or heterojunction smart chip or heterojunction power integrated circuit or heterojunction integrated circuit.

The skilled person will understand that in the preceding description and appended claims, positional terms such as 'top', 'above', 'overlap', 'under', 'lateral', etc. are made with reference to conceptual illustrations of a device, such as those showing standard cross-sectional perspectives and those shown in the appended drawings. These terms are used for ease of reference but are not intended to be of limiting nature. These terms are therefore to be understood as referring to a device when in an orientation as shown in the accompanying drawings.

Although the disclosure has been described in terms of preferred embodiments as set forth above, it should be understood that these embodiments are illustrative only and that the claims are not limited to those embodiments. Those skilled in the art will be able to make modifications and alternatives in view of the disclosure which are contemplated as falling within the scope of the appended claims. Each feature disclosed or illustrated in the present specification may be incorporated in the disclosure, whether alone or in any appropriate combination with any other feature disclosed or illustrated herein.

Many other effective alternatives will occur to the person skilled in the art. It will be understood that the disclosure is not limited to the described embodiments, but encompasses all the modifications which fall within the spirit and scope of the disclosure.

The invention claimed is:

1. A heterojunction chip comprising:
a III-nitride semiconductor based heterojunction power device comprising:
a first heterojunction transistor formed on a substrate, the first heterojunction transistor comprising:
a first III-nitride semiconductor region formed over the substrate, wherein the first III-nitride semiconductor region comprises a first heterojunction comprising at least one two dimensional carrier gas of a second conductivity type;
a first terminal operatively connected to the first III-nitride semiconductor region;
a second terminal laterally spaced from the first terminal and operatively connected to the first III-nitride semiconductor region;
a first highly doped semiconductor region of a first conductivity type formed over the first III-nitride semiconductor region, and between the first terminal and the second terminal; and
a first gate region being formed over the first III-nitride semiconductor region, and between the first terminal and the second terminal; and
a second heterojunction transistor formed on the substrate, the second heterojunction transistor comprising:
a second III-nitride semiconductor region formed over the substrate, wherein the second III-nitride semiconductor region comprises a second heterojunction comprising at least one two dimensional carrier gas of the second conductivity type;
a third terminal operatively connected to the second III-nitride semiconductor region;
a fourth terminal laterally spaced from the third terminal in a first dimension and operatively connected to the second III-nitride semiconductor region;
a first plurality of highly doped semiconductor regions of a first conductivity type formed over the second III-nitride semiconductor region, the first plurality of highly doped semiconductor regions being formed between the third terminal and the fourth terminal, wherein the first plurality of highly doped semiconductor regions comprises at least two highly doped semiconductor regions of the first conductivity type in contact with the second III-nitride semiconductor region and laterally spaced from each other in a second dimension that is perpendicular to the first dimension; and
a second gate region operatively connected to the first plurality of highly doped semiconductor regions,
wherein one of the first and second heterojunction transistors is an enhancement mode field effect transistor and the other of the first and second heterojunction transistors is a depletion mode field effect transistor; and
an interface circuit operatively connected with the second heterojunction transistor,
wherein the interface circuit is monolithically integrated with any of the first or the second heterojunction transistor.

2. A heterojunction chip according to claim 1, wherein the interface circuit is configured to provide one of the following functions: current control function, voltage control function and disable function.

3. A heterojunction chip according to claim 1, wherein the interface circuit comprises one or more current control blocks.

4. A heterojunction chip according to claim 3, wherein the one or more current control blocks comprise a resistive element which comprises a two dimensional electron gas or any existing layer, including metals, from which the heterojunction chip is fabricated.

5. A heterojunction chip according to claim 3, wherein the one or more current control blocks comprise a current source comprising a low-voltage depletion mode transistor and a resistive element, wherein a source of the low-voltage depletion mode transistor is connected to a first terminal of the resistive element and a gate of the low-voltage depletion mode transistor is connected to a second terminal of the resistive element, such that a second terminal of the resistive element and a drain of the low-voltage depletion mode transistor each form a terminal of the one or more current control blocks.

6. A heterojunction chip according to claim 3, wherein the one or more current control blocks comprise either (i) one or more low-voltage diodes, (ii) one or more low-voltage transistors with a gate connected to a source, or (iii) a low-voltage enhancement-mode transistor with a potential divider connected between a drain and source terminal of the enhancement-mode transistor, wherein the midpoint of the potential divider is connected to the gate terminal of the enhancement mode transistor.

7. A heterojunction chip according to claim 3, wherein the one or more current control blocks comprise a low-voltage depletion mode transistor or an enhancement mode transistor in series or in parallel to a resistive element in a current source wherein a gate of said transistor is connected to a node within a pull-down circuit.

8. A heterojunction chip according to claim 1, wherein the integrated interface circuit comprise one or more regulators to regulate an output voltage to a level required by an internal or external load or to provide an appropriate DC voltage as a supply rail to any of the low-voltage circuitry inside the heterojunction chip or outside the heterojunction chip.

9. A heterojunction chip according to claim 1, wherein the integrated interface circuit comprises one or more disable units which are controlled by internal or external signals in order to disable the start-up supply by turning-off or reducing the current through the second heterojunction transistor (start-up device) in order to reduce the power consumption.

10. A heterojunction chip according to claim 9, wherein the one or more disable units comprise one or more auxiliary low-voltage heterojunction transistors with a drain, source and gate, wherein the auxiliary gate region terminal of the auxiliary low-voltage heterojunction transistor is operatively connected to a current control circuit and a pull-down circuit.

11. A heterojunction chip according to claim 10, wherein the pull-down circuit comprises one or more normally-on or normally-off transistors in parallel or in series and several resistors, potential dividers or capacitors.

12. A heterojunction chip according to claim 10, wherein the pull-down circuit comprises a monolithically integrated temperature compensated block of components comprising a resistor in parallel with a series combination between a resistor and a low-voltage heterojunction transistor.

13. A heterojunction chip according to claim 9, further comprising additional capacitors, each forming a capacitance to a third terminal, integrated before and/or after each of the current control blocks and the one or more disable units.

14. A heterojunction chip according to claim 1, wherein the second gate region is connected to an internal or external ground or a potential that is near ground.

15. A heterojunction chip according to claim 1, wherein the second gate region is connected to a Kelvin terminal connected to the first terminal.

* * * * *